US012652060B2

(12) United States Patent
Haase et al.

(10) Patent No.: US 12,652,060 B2
(45) Date of Patent: Jun. 9, 2026

(54) ARITHMETIC ENCODER FOR ARITHMETICALLY ENCODING AND ARITHMETIC DECODER FOR ARITHMETICALLY DECODING A SEQUENCE OF INFORMATION VALUES, METHODS FOR ARITHMETICALLY ENCODING AND DECODING A SEQUENCE OF INFORMATION VALUES AND COMPUTER PROGRAM FOR IMPLEMENTING THESE METHODS

(71) Applicant: FRAUNHOFER-GESELLSCHAFT ZUR FOERDERUNG DER ANGEWANDTEN FORSCHUNG E.V., Munich (DE)

(72) Inventors: Paul Haase, Berlin (DE); Heiner Kirchhoffer, Berlin (DE); Karsten Mueller, Berlin (DE); Heiko Schwarz, Berlin (DE); Detlev Marpe, Berlin (DE); Thomas Wiegand, Berlin (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 19/291,758

(22) Filed: Aug. 6, 2025

(65) Prior Publication Data

US 2025/0357948 A1    Nov. 20, 2025

Related U.S. Application Data

(63) Continuation of application No. 18/296,055, filed on Apr. 5, 2023, now Pat. No. 12,413,244, and a
(Continued)

(30) Foreign Application Priority Data

Oct. 6, 2020    (EP) ..................................... 20200395

(51) Int. Cl.
H03M 7/30 (2006.01)
H03M 7/40 (2006.01)

(52) U.S. Cl.
CPC ....... H03M 7/6011 (2013.01); H03M 7/3064 (2013.01); H03M 7/4018 (2013.01); H03M 7/6005 (2013.01)

(58) Field of Classification Search
CPC ............. H03M 7/6011; H03M 7/3064; H03M 7/6005; H03M 7/42; H03M 7/4018
(Continued)

(56) References Cited

U.S. PATENT DOCUMENTS 5,309,381 A    5/1994  Fukui
6,850,175 B1   2/2005  Bossen
(Continued)

FOREIGN PATENT DOCUMENTS

CN    103152054 A    6/2013
CN    103782597 A    5/2014
(Continued)

OTHER PUBLICATIONS

Anonymous, "Context-adaptive binary arithmetic coding", Wikipedia. org, Nov. 18, 2019, Available at URL: https://en.wikipedia.org/w/index.php?title=Context-adaptive_binary_arithmetic_coding&oldid=868799469.

(Continued)

*Primary Examiner* — Peguy Jean Pierre
(74) *Attorney, Agent, or Firm* — PERRY + CURRIER INC.

(57) ABSTRACT

An encoding scheme is provided for arithmetically encoding a sequence of information values into an arithmetic coded bitstream by providing the bitstream with entry point information, allowing for resuming arithmetic decoding of the bitstream from a predetermined entry point onward. A
(Continued)

respective decoding scheme is also provided. These encoding and decoding schemes provide more efficient encoding in view of the decoding speed.

3 Claims, 3 Drawing Sheets

Related U.S. Application Data continuation of application No. PCT/EP2021/077458, filed on Oct. 5, 2021.

(58) Field of Classification Search
USPC ............................... 341/50, 65, 63, 106, 107
See application file for complete search history.

(56) References Cited

U.S. PATENT DOCUMENTS

| | | | |
|---|---|---|---|
| 7,386,446 B2 | 6/2008 | Schuller et al. | |
| 7,464,027 B2 | 12/2008 | Schuller et al. | |
| 7,587,311 B2 | 9/2009 | Schuler et al. | |
| 7,592,937 B1 | 9/2009 | Chang | |
| 7,630,440 B2 | 12/2009 | Prakasam | |
| 7,982,641 B1 | 7/2011 | Su et al. | |
| 8,762,159 B2 | 6/2014 | Geiger et al. | |
| 8,867,619 B2 | 10/2014 | Schwarz et al. | |
| 8,907,823 B2 | 12/2014 | Marpe et al. | |
| 9,129,597 B2 | 9/2015 | Bayer et al. | |
| 9,313,514 B2 | 4/2016 | Misra et al. | |
| 10,070,127 B2 | 9/2018 | Bossen | |
| 2001/0005432 A1 | 6/2001 | Takahashi et al. | |
| 2004/0056787 A1 | 3/2004 | Bossen | |
| 2004/0208383 A1 | 10/2004 | Bossen | |
| 2004/0260739 A1 | 12/2004 | Schumann | |
| 2005/0012648 A1 | 1/2005 | Marpe et al. | |
| 2008/0007436 A1 | 1/2008 | Banwait et al. | |
| 2008/0095276 A1 | 4/2008 | Choo | |
| 2008/0240597 A1 | 10/2008 | He et al. | |
| 2010/0295713 A1 | 11/2010 | Ueno et al. | |
| 2012/0082218 A1 | 4/2012 | Misra et al. | |
| 2012/0293343 A1 | 11/2012 | Lee et al. | |
| 2012/0300839 A1 | 11/2012 | Sze et al. | |
| 2013/0028334 A1 | 1/2013 | Bossen | |
| 2013/0064383 A1 | 3/2013 | Schnell et al. | |
| 2013/0223528 A1 | 8/2013 | Lim et al. | |
| 2014/0140400 A1 | 5/2014 | George et al. | |
| 2014/0210652 A1 | 7/2014 | Bartnik et al. | |
| 2014/0333458 A1 | 11/2014 | Marpe et al. | |
| 2014/0334552 A1 | 11/2014 | Yamaguchi et al. | |
| 2016/0050420 A1 | 2/2016 | Helmrich et al. | |
| 2016/0353113 A1 | 12/2016 | Zhang et al. | |
| 2017/0078668 A1 | 3/2017 | Misra et al. | |
| 2017/0195692 A1 | 7/2017 | Yu et al. | |
| 2017/0359591 A1 | 12/2017 | Said | |
| 2017/0364334 A1 | 12/2017 | Liu et al. | |
| 2018/0199046 A1 | 7/2018 | Chuang et al. | |
| 2018/0205952 A1* | 7/2018 | Said | H04N 19/126 |
| 2018/0234681 A1* | 8/2018 | Fu | H04N 19/182 |
| 2018/0338144 A1* | 11/2018 | Nam | H04N 19/149 |
| 2020/0186802 A1 | 6/2020 | Chuang et al. | |
| 2020/0396488 A1* | 12/2020 | Koo | H04N 19/18 |
| 2022/0217418 A1 | 7/2022 | Schwarz et al. | |
| 2022/0239924 A1 | 7/2022 | Kirchhoffer et al. | |
| 2023/0230606 A1 | 7/2023 | Tomasek et al. | |
| 2023/0238982 A1 | 7/2023 | Haase et al. | |

FOREIGN PATENT DOCUMENTS

| | | | |
|---|---|---|---|
| CN | 120934535 A | 5/2014 | |
| CN | 104980749 A | 10/2015 | |
| CN | 107465928 A | 12/2017 | |
| JP | 2013543284 A | 11/2013 | |
| WO | WO-2004028165 A2 | 4/2004 | |
| WO | WO-2009047695 A1 | 4/2009 | |
| WO | WO-212172114 A1 | 12/2012 | |
| WO | WO-2013002555 A2 | 1/2013 | |

OTHER PUBLICATIONS

Wiedemann, Simon, et al. "DeepCABAC: A universal compression algorithm for deep neural networks." IEEE Journal of Selected Topics in Signal Processing 14.4 (2020): 700-714.

ISO/IEC, "Information technology—Multimedia content description interface—Part 17: Compression of neural networks for multimedia content description and analysis", ISO/IEC 15938-17, Aug. 2022.

International Telecommunication Union, "Series H High efficiency video coding" ITU-T Telecommunication Standardization Sector of ITU, H.265, Nov. 2019.

International Telecommunication Union, "Versatile video coding" ITU-T Telecommunication Standardization Sector of ITU, H.266, Aug. 2020.

U.S. Appl. No. 19/291,790, Arithmetic Encoder for Arithmetically Encoding and Arithmetic Decoder for Arithmetically Decoding a Sequence of Information Values, Methods for Arithmetically Encoding and Decoding a Sequence of Information Values and Computer Program for Implementing These Methods, filed Aug. 6, 2025.

U.S. Appl. No. 19/291,819, Arithmetic Encoder for Arithmetically Encoding and Arithmetic Decoder for Arithmetically Decoding a Sequence of Information Values, Methods for Arithmetically Encoding and Decoding a Sequence of Information Values and Computer Program for Implementing These Methods, filed Aug. 6, 2025.

U.S. Appl. No. 19/292,047, Arithmetic Encoder for Arithmetically Encoding and Arithmetic Decoder for Arithmetically Decoding a Sequence of Information Values, Methods for Arithmetically Encoding and Decoding a Sequence of Information Values and Computer Program for Implementing These Methods, filed Aug. 6, 2025.

U.S. Appl. No. 19/292,095, Arithmetic Encoder for Arithmetically Encoding and Arithmetic Decoder for Arithmetically Decoding a Sequence of Information Values, Methods for Arithmetically Encoding and Decoding a Sequence of Information Values and Computer Program for Implementing These Methods, filed Aug. 6, 2025.

U.S. Appl. No. 19/292,142, Arithmetic Encoder for Arithmetically Encoding and Arithmetic Decoder for Arithmetically Decoding a Sequence of Information Values, Methods for Arithmetically Encoding and Decoding a Sequence of Information Values and Computer Program for Implementing These Methods, filed Aug. 6, 2025.

U.S. Appl. No. 19/293,121, Arithmetic Encoder for Arithmetically Encoding and Arithmetic Decoder for Arithmetically Decoding a Sequence of Information Values, Methods for Arithmetically Encoding and Decoding a Sequence of Information Values and Computer Program for Implementing These Methods, filed Aug. 7, 2025.

U.S. Appl. No. 19/293,159, Arithmetic Encoder for Arithmetically Encoding and Arithmetic Decoder for Arithmetically Decoding a Sequence of Information Values, Methods for Arithmetically Encoding and Decoding a Sequence of Information Values and Computer Program for Implementing These Methods, filed Aug. 7, 2025.

U.S. Appl. No. 19/293,189, Arithmetic Encoder for Arithmetically Encoding and Arithmetic Decoder for Arithmetically Decoding a Sequence of Information Values, Methods for Arithmetically Encoding and Decoding a Sequence of Information Values and Computer Program for Implementing These Methods, filed Aug. 7, 2025.

* cited by examiner

100

Symbolizing information
values into symbol strings —101

Subdividing current interval —103

Selecting subinterval —104     —102

Renormalizing encoder-internal
parameters —105

Providing bitstream with
entry point information —106

ARITHMETIC ENCODER FOR ARITHMETICALLY ENCODING AND ARITHMETIC DECODER FOR ARITHMETICALLY DECODING A SEQUENCE OF INFORMATION VALUES, METHODS FOR ARITHMETICALLY ENCODING AND DECODING A SEQUENCE OF INFORMATION VALUES AND COMPUTER PROGRAM FOR IMPLEMENTING THESE METHODS

CROSS-REFERENCES TO RELATED APPLICATIONS

This application is a continuation of U.S. application Ser. No. 18/296,055, filed Apr. 5, 2023, which is incorporated herein by reference in its entirety, and which is a continuation of International Application No. PCT/EP2021/077458, filed Oct. 5, 2021, which is incorporated herein by reference in its entirety, and additionally claims priority from European Application No. EP 20 200 395.0, filed Oct. 6, 2020, which is incorporated herein by reference in its entirety.

The present application is concerned with arithmetically encoding a sequence of information values into an arithmetic coded bitstream, particularly by providing the bitstream with entry point information allowing for resuming arithmetic decoding the bitstream from a predetermined entry point onward.

Embodiments according to the invention are related to an arithmetic encoder for arithmetically encoding a sequence of information values.

Further embodiments according to the invention are related to an arithmetic decoder for arithmetically decoding a sequence of information values.

Further embodiments according to the invention are related to a method for arithmetically encoding a sequence of information values.

Further embodiments according to the invention are related to a method for arithmetically decoding a sequence of information values.

Further embodiments according to the invention are related to a computer program for performing methods for arithmetically encoding and decoding a sequence of information values.

Further embodiments according to the invention are related to a bitstream generated using an arithmetic encoder for arithmetically encoding a sequence of information values.

Further embodiments according to the invention are related to an arithmetic encoder for arithmetically encoding a neural network parameters.

Further embodiments according to the invention are related to an arithmetic decoder for arithmetically decoding a neural network parameters.

The invention can be applied to arbitrary data compression applications that involve the signaling of integer values like, for example, the compression of the parameters of neural networks.

BACKGROUND OF THE INVENTION

A multitude of devices and methods for arithmetic encoding and decoding of values sequences are currently known. Particularly, a context-based adaptive binary arithmetic coding (CABAC) is widely used for encoding and decoding of a sequence of symbols. In a binarization stage of CABAC each symbol of such a sequence is converted into a sequence of one or more binary symbols (bins) and the concatenation of these bin sequences is arithmetically encoded into a bitstream. A context modeling stage then associates a probability estimate with each bin for arithmetic coding based on previously encoded bins and context information. The corresponding decoder has the same information available and can reproduce the same probability estimates in order to carry out arithmetic decoding.

The known arithmetic decoding is, however, a highly sequential process that can hardly be parallelized. A decoding speed of CABAC decoder is thus limited by its serial coding procedure.

In view of the above, there is a desire to create a coding and decoding concept which enables several decoders to operate in parallel decoding different parts of a single bitstream, which leads to an improved decoding speed.

Accordingly, it is the object of the present invention to provide an encoding concept which is more efficient in view of the decoding speed. This object is achieved by the subject matter of the pending independent claims.

Further advantageous aspects are the subject of the dependent claims.

SUMMARY

An embodiment may have an arithmetic encoder for arithmetically encoding a sequence of information values into an arithmetic coded bitstream, configured to: symbolize the information values into symbol strings so as to acquire a sequence of symbols; arithmetically encode the sequence of symbols by, for each symbol, selecting a subinterval out of a plurality of subintervals into which a current interval, which defines a current version of an coding state of the arithmetic encoder, is subdivided according to a probability estimate for the respective symbol, according to a symbol value of the respective symbol so as to acquire an updated version of the coding state of the arithmetic encoder, defined by the selected subinterval, for encoding a next symbol of the sequence of symbols, and renormalizing encoder-internal parameters which define the coding state under continuing the bitstream, provide the bitstream with entry point information allowing for resuming arithmetic decoding the bitstream from a predetermined entry point onward.

Another embodiment may have an arithmetic decoder for arithmetically decoding a sequence of information values from a bitstream, configured to: derive from the bitstream entry point information; use the entry point information so as to resume arithmetically decoding the bitstream from a predetermined entry point onward by arithmetically decoding a sequence of symbols from the bitstream by, for each symbol of the bitstream: determining, based on a current version of a coding state of the arithmetic decoder, a subinterval out of a plurality of subintervals into which a current interval is subdivided according to a probability estimate for the respective symbol, and deduce, based on the selected subinterval, a symbol value of the respective symbol, and renormalizing and updating decoder-internal parameters which define the coding state by use of the bitstream and the selected subinterval so as to acquire an updated version of the coding state of the arithmetic decoder for decoding a next symbol of the sequence of symbols, and derive the information values from the sequence of symbols by desymbolization.

Another embodiment may have a method of arithmetically encoding a sequence of information values into an arithmetic coded bitstream, comprising: symbolizing the information values into symbol strings so as to acquire a sequence of symbols; arithmetically encoding the sequence of symbols by subdividing a current interval, which defines a current version of an coding state of an arithmetic encoder, for each symbol, according to a probability estimate for the respective symbol, selecting a subinterval out of a plurality of the subintervals according to a symbol value of the respective symbol so as to acquire an updated version of the coding state of the arithmetic encoder, defined by the selected subinterval, for encoding a next symbol of the sequence of symbols, and renormalizing encoder-internal parameters which define the coding state under continuing the bitstream, providing the bitstream with entry point information allowing for resuming arithmetic decoding the bitstream from a predetermined entry point onward.

Another embodiment may have a method of arithmetically decoding a sequence of information values from a bitstream, comprising: deriving from the bitstream entry point information; using the entry point information so as to resume arithmetically decoding the bitstream from a predetermined entry point onward by arithmetically decoding a sequence of symbols from the bitstream by, for each symbol of the bitstream: determining, a current version of an coding state of an arithmetic decoder, a subinterval out of a plurality of subintervals into which a current interval is subdivided according to a probability estimate for the respective symbol, and deducing, based on the selected subinterval, a symbol value of the respective symbol, and renormalizing and updating decoder-internal parameters which define the coding state by use of the bitstream and the selected subinterval so as to acquire an updated version of the coding state of the arithmetic decoder for decoding a next symbol of the sequence of symbols, and deriving the information values from the sequence of symbols by desymbolization.

Another embodiment may have non-transitory digital storage medium having a computer program stored thereon to perform the inventive methods when said computer program is run by a computer.

Another embodiment may have bitstream generated using an arithmetic encoder according to the invention.

An embodiment according to the invention creates an arithmetic encoder for arithmetically encoding a sequence of information values into an arithmetic coded bitstream. The arithmetic encoder is configured to symbolize the information values into symbol strings so as to obtain a sequence of symbols; arithmetically encode the sequence of symbols by, for each symbol, selecting a subinterval out of a plurality of subintervals into which a current interval, which defines a current version of an coding state of the arithmetic encoder, is subdivided according to a probability estimate for the respective symbol, according to a symbol value of the respective symbol so as to obtain an updated version of the coding state of the arithmetic encoder, defined by the selected subinterval, for encoding a next symbol of the sequence of symbols, and renormalizing encoder-internal parameters, e.g. parameters R and L, which define the coding state under continuing the bitstream, and provide the bitstream with entry point information allowing for resuming arithmetic decoding the bitstream from a predetermined entry point onward.

This embodiment is based on the finding that providing the bitstream with the entry point information enables parallelizing of the arithmetic decoding, such as CABAC decoding, for example when several decoders operate in parallel decoding different parts of a single bitstream. This leads to a more efficient encoding and decoding concept, particularly to an improved decoding speed.

According to an embodiment, the entry point information comprises information on an coding state of an arithmetic decoder, which occurs in the arithmetic decoder when the arithmetic decoder decodes the bitstream until the predetermined entry point. This allows using several decoders to parallelize decoding starting from several predetermined entry points.

According to an embodiment, the arithmetic encoder is configured to perform the arithmetic decoding the bitstream so as to determine the information on the coding state of the arithmetic decoder. As an example, the arithmetic decoding may be executed after having finalized the arithmetic encoding. Alternatively, arithmetic decoding may be commenced in parallel with the arithmetic encoding, at a slight inter-bitstream-bit-distance between the bit position at which the arithmetic encoding continues to append bits and the bitstream begin at which the arithmetic decoding starts.

According to an embodiment, the coding state of the arithmetic decoder is defined by decoder-internal parameters including an interval width parameter indicating a width of the interval and a pointer pointing into the interval and the information on the coding state of the arithmetic decoder comprises a value of the pointer, e.g. which value is assumed by the pointer at the predetermined entry point.

According to an embodiment, the arithmetic encoder is configured to perform the arithmetic decoding the bitstream and set the value of the pointer comprised by the information on the coding state of the arithmetic decoder to be equal to a current value of the pointer as manifesting itself in the arithmetic decoding the bitstream up to the predetermined entry point.

According to an embodiment, the coding state of the arithmetic decoder is defined by decoder-internal parameters including an interval width parameter indicating a width of the interval and a pointer pointing into the interval and the information on the coding state of the arithmetic decoder comprises a value of the interval width parameter, e.g. which value is assumed by the interval width parameter at the predetermined entry point.

According to an embodiment, the arithmetic encoder is configured to perform the arithmetic decoding the bitstream and set the value of the interval width parameter comprised by the information on the coding state of the arithmetic decoder to be equal to a current value of the interval width parameter as manifesting itself in the arithmetic decoding the bitstream up to the predetermined entry point. Alternatively the arithmetic encoder is configured to set the value of the interval width parameter comprised by the information on the coding state of the arithmetic decoder to be equal to a current value of the interval width parameter as manifesting itself in the arithmetic encoding the sequence of symbols up to the predetermined entry point.

According to an embodiment, the coding state of the arithmetic decoder is defined by decoder-internal parameters including an interval width parameter indicating a width of the interval and a pointer pointing into the interval and the information on the coding state of the arithmetic decoder comprises a value of the pointer, e.g. which value is assumed by the pointer at the predetermined entry point, while being free of a value of the interval width parameter. In this embodiment the arithmetic encoder is configured to set the value of the interval width parameter comprised by the information on the coding state of the arithmetic decoder to be equal to a predetermined value and use the predetermined value for the interval width parameter when resuming the arithmetic encoding the sequence of symbols from the predetermined entry point onwards. Alternatively, in this embodiment the arithmetic encoder is configured to preliminarily interrupt the arithmetic encoding the sequence of symbols by arithmetically encoding a symbol of a predetermined symbol value immediately ahead the predetermined entry point before resuming the arithmetic encoding the sequence of symbols from the predetermined entry point onwards, and set the value of the interval width parameter comprised by the information on the coding state of the arithmetic decoder to be equal to a current value of the interval width parameter as manifesting itself in the arithmetic encoding the sequence of symbols up to the predetermined entry point, including the symbol of the predetermined symbol value.

According to an embodiment, the entry point information comprises a bitstream pointer to a predetermined bit in the bitstream, which is up to be read next after the resuming the arithmetic decoding the bitstream from the predetermined entry point onwards.

According to an embodiment, the bitstream pointer to the predetermined bit in the bitstream is signaled in the bitstream in form of an offset relative to a begin, e.g. a leading end from which onwards the bitstream is to be decoded, of the bitstream.

According to an embodiment, the bitstream pointer to the predetermined bit in the bitstream is signaled in the bitstream in form of an offset relative to a trailing end of a run of leading bits of the bitstream based on which an coding state, e.g. the pointer into the interval, of the arithmetic decoder for performing the arithmetic decoding of the bitstream is to be initialized.

According to an embodiment, the entry point information allows for resuming arithmetic decoding the bitstream from more than one entry point onward, and the bitstream pointer to the predetermined bit in the bitstream is signaled in the bitstream in form of an offset relative to a previous entry point. The entry point information, for example, comprises more than one information instantiations, namely one per entry point. Alternatively, the bitstream pointer to the predetermined bit in the bitstream is signaled in the bitstream in form of an offset relative to a predefined bitstream position which is associated with the predetermined entry point. For instance, nth predefined bitstream position is associated with nth entropy point; the predefined bitstream positions might be located mutually equi-distanced.

According to an embodiment, the arithmetic encoder is configured to locate the predefined bitstream position as a point between consecutive ones of the sequence of values, in other words: syntactically, or by counting bits of the bitstream, or in other words: on bit level.

According to an embodiment, the bitstream pointer to the predetermined bit in the bitstream is stored in units of bits, and/or an integer multiple n of bits, with n>1, and n=8, for example.

According to an embodiment, a bit position in the bitstream of the previous entry point is signaled in the bitstream.

According to an embodiment, the bitstream pointer is signaled in the bitstream differentially with respect to a further bit stream pointer which is comprised by the entry point information for pointing to a further predetermined bit in the bitstream, which is up to be read next after a resuming the arithmetic decoding the bitstream from a preceding entry point onwards.

According to an embodiment, the bitstream pointer is signaled in the bitstream using a variable length code.

According to an embodiment, the bitstream pointer is signaled in the bitstream using an Exponential-Golomb code, preferably an unsigned Exponential-Golomb code.

According to an embodiment, the predetermined entry point is a third or any of entry points following after the third entry point relative to the begin of the bitstream, and the bitstream pointer to the predetermined bit in the bitstream is signaled in the bitstream in form of a difference between the offset relative to the previous entry point and an offset of the previous entry point relative to a further entry point preceding the previous entry point.

According to an embodiment, the bitstream pointer is signaled in the bitstream using a signed Exponential-Golomb code.

According to an embodiment, the bit position in the bitstream of the previous entry point is signaled in the bitstream using an unsigned Exponential-Golomb code.

According to an embodiment, an exponential Golomb code parameter for the Exponential-Golomb code is a value of 11.

According to an embodiment, the bitstream pointer is signaled in the bitstream using a signed Exponential-Golomb code.

According to an embodiment, an exponential Golomb code parameter for the Exponential-Golomb code is a value of 7.

According to an embodiment, the arithmetic encoder is configured to use context-adaptive arithmetic coding for arithmetically encoding the sequence of symbols, including selecting, for a context-adaptively encoded symbol of the sequence of symbols, a context model out of a plurality of context models, each of which has a probability estimate associated therewith, and adapting the probability estimates of the plurality of context models to actual symbol statistics using previously encoded symbols of the sequence of symbols. The entry point information is indicative of, for each of a set of one or more predetermined context models, a predetermined probability estimate for the respective predetermined context model. The arithmetic encoder is configured to use the predetermined probability estimate in resuming the adaptation of the probability estimates of the plurality of context models with respect to the respective predetermined context model.

According to an embodiment, the arithmetic encoder is configured to use context-adaptive arithmetic coding for arithmetically encoding the sequence of symbols, including selecting, for a context-adaptively encoded symbol of the sequence of symbols, a context model out of a plurality of context models, each of which has a probability estimate associated therewith, and adapting the probability estimates of the plurality of context models to actual symbol statistics using previously encoded symbols of the sequence of symbols. The arithmetic encoder is configured to, for each of a set of one or more predetermined context models, set the probability estimate for the respective predetermined context model at the predetermined entry point to a default state and the arithmetic encoder is configured to use the default state in resuming the adaptation of the probability estimates of the plurality of context models with respect to the respective predetermined context model. Alternatively in this embodiment the arithmetic encoder is configured to, for each of a set of one or more predetermined context models, set the probability estimate for the respective predetermined context model at the predetermined entry point to a saved state manifesting itself at a predetermined condition during arithmetically encoding the sequence of symbols ahead the predetermined entry point and the arithmetic encoder is configured to use the saved state in resuming the adaptation of the probability estimates of the plurality of context models with respect to the respective predetermined context model.

According to an embodiment, the arithmetic encoder is configured to use dependent quantization for deriving the sequence of information values from a sequence of unquantized values using state machine, wherein the entry point information comprises a quantization state manifesting itself in the state machine up to the predetermined entry point.

According to an embodiment, the symbols are bins and the symbolization is a binarization.

According to an embodiment, the information values is a sequence of syntax elements which represent a video.

According to an embodiment, the information values are neural network parameters.

An embodiment according to the invention creates an arithmetic decoder for arithmetically decoding a sequence of information values from a bitstream. The arithmetic decoder is configured to: derive from the bitstream entry point information; use the entry point information so as to resume arithmetically decoding the bitstream from a predetermined entry point onward by arithmetically decoding a sequence of symbols from the bitstream by, for each symbol of the bitstream: determining, based on a current version of a coding state of the arithmetic decoder, a subinterval out of a plurality of subintervals into which a current interval is subdivided according to a probability estimate for the respective symbol, and deduce, based on the selected subinterval, a symbol value of the respective symbol, and renormalizing and updating decoder-internal parameters, e.g. R and V, which define the coding state by use of the bitstream and the selected subinterval so as to obtain an updated version of the coding state of the arithmetic decoder for decoding a next symbol of the sequence of symbols, and derive the information values from the sequence of symbols by desymbolization.

The arithmetic decoder according to this embodiment is based on the same considerations as the arithmetic encoder described above.

According to an embodiment, the arithmetic decoder is configured to use the entry point information so as to determine a starting version of the coding state of the arithmetic decoder and use the starting state for commencing arithmetically decoding the bitstream from the predetermined entry point onwards.

According to an embodiment, the coding state of the arithmetic decoder is defined by the decoder-internal parameters which include an interval width parameter indicating a width of the interval and a pointer pointing into the interval and the arithmetic decoder is configured to derive from the entry point information a starting value of the pointer, e.g. which value is assumed by the pointer at the predetermined entry point, using which the arithmetically decoding the bitstream from the predetermined entry point onwards is commenced.

According to an embodiment, the coding state of the arithmetic decoder is defined by the decoder-internal parameters which include an interval width parameter indicating a width of the interval and a pointer pointing into the interval and the arithmetic decoder is configured to derive from the entry point information a starting value of the interval width parameter, e.g. which value is assumed by the interval width parameter at the predetermined entry point, using which the arithmetically decoding the bitstream from the predetermined entry point onwards is commenced.

According to an embodiment, the coding state of the arithmetic decoder is defined by the decoder-internal parameters which include an interval width parameter indicating a width of the interval and a pointer pointing into the interval and the arithmetic decoder is configured to derive from the entry point information a starting value of the pointer, e.g. which value is assumed by the pointer at the predetermined entry point, using which the arithmetically decoding the bitstream from the predetermined entry point onwards is commenced and to set the value of the interval width parameter comprised by the information on the coding state of the arithmetic decoder to be equal to a predetermined value and use the predetermined value for the interval width parameter for resuming the arithmetic decoding the sequence of symbols from the predetermined entry point onwards.

According to an embodiment, the entry point information allows for resuming arithmetic decoding the bitstream from more than one entry point onward and the arithmetic decoder is configured to preliminary interrupting the arithmetic decoding the sequence of symbols at a subsequent predetermined entry point by arithmetically decoding a symbol of a predetermined symbol value immediately ahead the subsequent predetermined entry point before resuming the arithmetic decoding the sequence of symbols from the subsequent predetermined entry point onwards.

According to an embodiment, the arithmetic decoder is configured to derive from the entry point information a bitstream pointer to a predetermined bit in the bitstream and use the predetermined bit as a bit to be read next after resuming the arithmetic decoding the bitstream from the predetermined entry point onwards.

According to an embodiment, the bitstream pointer to the predetermined bit in the bitstream is signaled in the bitstream in form of an offset relative to a begin, e.g. a leading end from which onwards the bitstream is to be decoded, of the bitstream.

According to an embodiment, the bitstream pointer to the predetermined bit in the bitstream is signaled in the bitstream in form of an offset relative to a trailing end of a run of leading bits of the bitstream based on which the arithmetic decoder is configured to initialize the coding state, e.g. the pointer into the interval, of the arithmetic decoder in case of performing the arithmetic decoding of the bitstream from the begin of the bitstream onwards.

According to an embodiment, the entry point information allows for resuming arithmetic decoding the bitstream from more than one entry point onward, and the bitstream pointer to the predetermined bit in the bitstream is signaled in the bitstream in form of an offset relative to a previous entry point or relative to a predefined bitstream position which is associated with the predetermined entry point. For instance, $n^{th}$ predefined bitstream position is associated with nth entropy point; the predefined bitstream positions might be located mutually equi-distanced.

According to an embodiment, the arithmetic decoder is configured to locate the predefined bitstream position as a point between consecutive ones of the sequence of values, in other words: syntactically, or by counting bits of the bitstream, or in other words: on bit level.

According to an embodiment, the bitstream pointer to the predetermined bit in the bitstream is stored in units of bits, and/or an integer multiple n of bits, with n>1, and n=8, for example.

According to an embodiment, a bit position in the bitstream of the previous entry point is signaled in the bitstream.

According to an embodiment, the bitstream pointer is signaled in the bitstream differentially with respect to a further bit stream pointer which is comprised by the entry point information for pointing to a further predetermined bit in the bitstream, which is up to be read next after a resuming the arithmetic decoding the bitstream from a preceding entry point onwards.

According to an embodiment, the bitstream pointer is signaled in the bitstream using a variable length code.

According to an embodiment, the bitstream pointer is signaled in the bitstream using an Exponential-Golomb code, preferably an unsigned Exponential-Golomb code.

According to an embodiment, the predetermined entry point is a third or any of entry points following after the third entry point relative to the begin of the bitstream, and the bitstream pointer to the predetermined bit in the bitstream is signaled in the bitstream in form of a difference between the offset relative to the previous entry point and an offset of the previous entry point relative to a further entry point preceding the previous entry point.

According to an embodiment, the bitstream pointer is signaled in the bitstream using a signed Exponential-Golomb code.

According to an embodiment, the bit position in the bitstream of the previous entry point is signaled in the bitstream using an unsigned Exponential-Golomb code.

According to an embodiment, an exponential Golomb code parameter for the Exponential-Golomb code is a value of 11.

According to an embodiment, the bitstream pointer is signaled in the bitstream using a signed Exponential-Golomb code.

According to an embodiment, an exponential Golomb code parameter for the Exponential-Golomb code is a value of 7.

According to an embodiment, the arithmetic decoder is configured to use context-adaptive arithmetic decoding for arithmetically decoding the sequence of symbols, including selecting, for a context-adaptively decoded symbol of the sequence of symbols, a context model out of a plurality of context models, each of which has a probability estimate associated therewith, and adapting the probability estimates of the plurality of context models to actual symbol statistics using previously decoded symbols of the sequence of symbols, wherein the entry point information is indicative of, for each of a set of one or more predetermined context models, a predetermined probability estimate for the respective predetermined context model, and the arithmetic decoder is configured to use the predetermined probability estimate in resuming the adaptation of the probability estimates of the plurality of context models with respect to the respective predetermined context model.

According to an embodiment, the arithmetic decoder is configured to use context-adaptive arithmetic decoding for arithmetically decoding the sequence of symbols, including selecting, for a context-adaptively decoded symbol of the sequence of symbols, a context model out of a plurality of context models, each of which has a probability estimate associated therewith, and adapting the probability estimates of the plurality of context models to actual symbol statistics using previously decoded symbols of the sequence of symbols, wherein the arithmetic decoder is configured to, for each of a set of one or more predetermined context models, set the probability estimate for the respective predetermined context model at the predetermined entry point to a default state and the arithmetic decoder is configured to use the default state in resuming the adaptation of the probability estimates of the plurality of context models with respect to the respective predetermined context model.

According to an embodiment, the entry point information allows for resuming arithmetic decoding the bitstream from more than one entry point onward and the arithmetic decoder is configured to for each of the set of one or more predetermined context models, set the probability estimate for the respective predetermined context model at a subsequent predetermined entry point to a saved state manifesting itself at a predetermined condition during arithmetically decoding the sequence of symbols ahead the subsequent predetermined entry point and the arithmetic decoder is configured to use the saved state in resuming the adaptation of the probability estimates of the plurality of context models with respect to the respective predetermined context model from the subsequent predetermined entry point onwards, e.g. here the decoder might arithmetically decode the bitstream in parallel: once from the beginning using signaled or default context states, and starting from the entry point onwards as soon as the predetermined condition is met, such as a certain number of information values as been decoded or the like.

According to an embodiment, the arithmetic decoder is configured to use dependent dequantization for deriving from the sequence of information values a sequence of quantized values using a state machine, derive from the entry point information a quantization state starting with which the dependent quantization is resumed from the predetermined entry point onwards.

According to an embodiment, the symbols are bins and the desymbolization is a debinarization.

According to an embodiment, the information values is a sequence of syntax elements which represent a video.

According to an embodiment, the information values are neural network parameters.

An embodiment according to the invention creates a method of arithmetically encoding a sequence of information values into an arithmetic coded bitstream, comprising: symbolizing the information values into symbol strings so as to obtain a sequence of symbols; arithmetically encoding the sequence of symbols by subdividing a current interval, which defines a current version of an coding state of an arithmetic encoder, for each symbol, according to a probability estimate for the respective symbol, selecting a subinterval out of a plurality of the subintervals according to a symbol value of the respective symbol so as to obtain an updated version of the coding state of the arithmetic encoder, defined by the selected subinterval, for encoding a next symbol of the sequence of symbols, and renormalizing encoder-internal parameters which define the coding state under continuing the bitstream, providing the bitstream with entry point information allowing for resuming arithmetic decoding the bitstream from a predetermined entry point onward.

The method according to this embodiment is based on the same considerations as an apparatus for encoding described above. Moreover, this disclosed embodiment may optionally be supplemented by any other features, functionalities and details disclosed herein in connection with the apparatus for encoding, both individually and taken in combination.

An embodiment according to the invention creates a method of arithmetically decoding a sequence of information values from a bitstream, comprising: deriving from the bitstream entry point information; using the entry point information so as to resume arithmetically decoding the bitstream from a predetermined entry point onward by arithmetically decoding a sequence of symbols from the bitstream by, for each symbol of the bitstream: determining, a current version of an coding state of an arithmetic decoder, a subinterval out of a plurality of subintervals into which a current interval is subdivided according to a probability estimate for the respective symbol, and deducing, based on the selected subinterval, a symbol value of the respective symbol, and renormalizing and updating decoder-internal parameters which define the coding state by use of the bitstream and the selected subinterval so as to obtain an updated version of the coding state of the arithmetic decoder for decoding a next symbol of the sequence of symbols, and deriving the information values from the sequence of symbols by desymbolization.

The method according to this embodiment is based on the same considerations as an apparatus for decoding described above. Moreover, this disclosed embodiment may optionally be supplemented by any other features, functionalities and details disclosed herein in connection with the apparatus for decoding, both individually and taken in combination.

An embodiment according to the invention creates a computer program having a program code for performing, when running on a computer, methods according to any of embodiments described above.

An embodiment according to the invention creates a bitstream generated using an arithmetic encoder of any of the embodiments described herein.

An embodiment according to the invention creates an arithmetic decoder for arithmetically decoding neural network parameters from a bitstream, configured to: arithmetically decode a sequence of symbols from the bitstream by use of context-adaptive arithmetic decoding, including selecting, for a context-adaptively decoded symbol of the sequence of symbols, a context model out of a plurality of context models, each of which has a probability estimate associated therewith and arithmetically decoding the context-adaptively decoded symbol using the selected context model, and adapting the probability estimates of the plurality of context models to actual symbol statistics using previously decoded symbols of the sequence of symbols, derive the neural network parameters from the sequence of symbols by desymbolization, at the beginning of the bitstreams and/or at one or more entry points within the bitstream, initialize, for each of a set, maybe all, but maybe only a portion, of the plurality, of one or more context models, the probability estimate associated with the respective context model based on context model information in the bitstream.

According to an embodiment, the arithmetic decoder is configured to adapt the probability estimates of the plurality of context models to actual symbol statistics using previously decoded symbols of the sequence of symbols by, for each context model, generating the probability estimate associated with the respective context model on the basis of previously context-adaptively decoded symbols of the sequence of symbols for which the respective context model has been selected.

According to an embodiment, the arithmetic decoder is configured to adapt the probability estimates of the plurality of context models to actual symbol statistics using previously decoded symbols of the sequence of symbols by deriving a first hypothesis for the probability estimates at a manner which adapts to the actual symbol statistics at a first adaptation agility which is controllable by a first agility parameter, at the beginning of the bitstream and/or at one or more entry points within the bitstream, set, for each of the set of one or more context models, the first hypothesis and the first agility parameter associated with the respective context model based on the context model information in the bitstream.

According to an embodiment, the arithmetic decoder is configured to adapt the probability estimates of the plurality of context models to actual symbol statistics using previously decoded symbols of the sequence of symbols by deriving a second hypothesis for the probability estimates at a manner which adapts to the actual symbol statistics at a second adaptation agility which is controllable by a second agility parameter, wherein the probability estimates are determined by an average of the first and second hypotheses, at the beginning of the bitstream and/or at one or more entry points within the bitstream, set, for each of the set of one or more context models, the second hypothesis and the second agility parameter associated with the respective context model based on the context model information in the bitstream.

According to an embodiment, the context model information in the bitstream comprises a table entry index into a table of quadruples of values for defining the first and second hypotheses and the first and second agility parameters, and the arithmetic decoder is configured to use the table entry index so as to select one quadruple of the table and to use the one quadruple so as to set the first and second hypotheses and the first and second agility parameters.

According to an embodiment, a number of the quadruples of values for defining the first and second hypotheses and the first and second agility parameters lies between 8 and 10, both inclusively. See the table below where nine lines/quadruples exist.

According to an embodiment, the quadruples of values for defining the first and second hypotheses and the first and second agility parameters correspond to one of 3, 4 or 5 mutually distinguishable settings for the first and second agility parameters. See the table below where (1,4), (2,6), (0,5) or (3,5) exist.

According to an embodiment, the symbols are bins and the desymbolization is a debinarization and the quadruples of values for defining the first and second hypotheses and the first and second agility parameters comprise first 3 quadruples (e.g., cp. 1,4,0,0, 1,4,95,1519 and 1,4,−41,−654) according to all of which the first agility parameter is set to a first value, the second agility parameter is set to a second value, which corresponds to lower adaptation agility than the first value, and according to a first one of which the first and second hypotheses correspond to equi-probability, according to a second one of which the first and second hypotheses correspond to a first bin value being more probable than a second bin value, and according to a third one of which the first and second hypotheses correspond to the second bin value being more probable than the first bin value, second 3 quadruples (e.g., cp. 2,6,95,1519, 2,6,30,482 and 2,6,−21,−337) according to all of which the first agility parameter is set to a third value, which corresponds to lower adaptation agility than the first value, and larger adaptation agility than the second value, and the second agility parameter is set to a fourth value, which corresponds to lower adaptation agility than the second value, and according to a first and second one of which the first and second hypotheses correspond to the first bin value being more probable than the second bin value, and according to a third one of which the first and second hypotheses correspond to the second bin value being more probable than the first bin value, 2 quadruples (e.g., cp. 3,5,0,0 and 3,5,30,482) according to all of which the first agility parameter is set to a fourth value, which corresponds to lower adaptation agility than the third value, and larger adaptation agility than the second value, and the second agility parameter is set to a sixth value, which corresponds to lower adaptation agility than the second value, and larger adaptation agility than the fourth value, and according to a first one of which the first and second hypotheses correspond to equi-probability, and according to a second one of which the first and second hypotheses correspond to the first bin value being more probable than the second bin value, 1 quadruple (e.g., cp. 0,5,0,0) according to which the first agility parameter is set to a seventh value, which corresponds to larger adaptation agility than the first value, and according to which the first and second hypotheses correspond to equi-probability.

According to an embodiment, the symbols are bins and the desymbolization is a debinarization and the arithmetic decoder is configured to adapt the probability estimates of the plurality of context models to actual symbol statistics using previously decoded symbols of the sequence of symbols by, for each of the first and second hypotheses, representing the respective hypothesis by means of a singed integer, respectively, which, when being zero, is indicative of equi-probability, which, when being larger than zero, is indicative of a first bin value being more probable than a second bin value, and which, when being lower than zero, is indicative of the second bin value being more probable than the first bin value, for each context model, increase the singed integer if a currently decoded bin has the first bin value, and decrease the singed integer if a currently decoded bin has the second bin value, at an amount which is controlled by the first agility parameter with respect to the first hypothesis and controlled by the second agility parameter with respect to the second hypothesis so that the amount is the larger the smaller the first and second agility parameter is, respectively, wherein the probability estimates are determined by an average of the first and second singed integers.

According to an embodiment, the arithmetic decoder is configured to determine the amount for the increase and decrease by use of a transition table.

According to an embodiment, the arithmetic decoder is configured to use the same transition table for the first and second hypotheses.

According to an embodiment, the arithmetic decoder is configured to determine the amount for the increase and decrease by use of the transition table by looking up the transition table at an entry indexed by a table index determined by the signed integer to obtain a transition step and dividing the transition step size by 2 to a power which depends on the first and second adaptation parameter, respectively, wherein the transition step determines the amount.

According to an embodiment, the signed integer is represented by a 2's-complement representation with n bits, with n being larger for the second hypothesis than for the first hypothesis, (8 and 12 in the example below in the detailed description); that is, the "scale" for second hypothesis is larger/finer as compared to the first hypothesis so that the agility is reduced if the transition steps were the same, wherein the arithmetic decoder is configured to determine the amount for the increase and decrease by use of the transition table by looking up the transition table at an entry indexed by a sum of the signed integer divided by $2^{n-m}$ on the one hand and $2^{m-1}$ on the other hand (m=5 in the example below in the detailed description) in case to obtain a transition step dividing (thus, the adaptation steps which determine adaptation agility are determined by agility parameter) the transition step size by 2 to a power which affine linearly (4+shift0 and shift1, respectively) depends on the first and second adaptation parameter, respectively, wherein the transition step determines the amount. The dependency may be such that the agility was the same between first and second hypotheses if first and second agility parameter were the same; above this is done by "4+", i.e. by adding the difference of n between first and second hypotheses to the agility parameter of the first hypothesis.

According to an embodiment, the transition steps are stored in the entries of the transition table increase or decrease monotonically.

An embodiment according to the invention creates an arithmetic encoder for arithmetically encoding neural network parameters into a bitstream, configured to: derive from the neural network parameters a sequence of symbols by symbolization, arithmetically encode the sequence of symbols into the bitstream by use of context-adaptive arithmetic encoding, including selecting, for a context-adaptively encoded symbol of the sequence of symbols, a context model out of a plurality of context models, each of which has a probability estimate associated therewith and arithmetically encoding the context-adaptively encoded symbol using the selected context model, and adapting the probability estimates of the plurality of context models to actual symbol statistics using previously encoded symbols of the sequence of symbols, at the beginning of the bitstreams and/or at one or more entry points within the bitstream, initialize, for each of a set of one or more context models, the probability estimate associated with the respective context model according to context model information signaled in the bitstream.

According to an embodiment, the arithmetic encoder is configured to adapt the probability estimates of the plurality of context models to actual symbol statistics using previously encoded symbols of the sequence of symbols by for each context model, generating the probability estimate associated with the respective context model on the basis of previously context-adaptively encoded symbols of the sequence of symbols for which the respective context model has been selected.

According to an embodiment, the arithmetic encoder is configured to adapt the probability estimates of the plurality of context models to actual symbol statistics using previously encoded symbols of the sequence of symbols by deriving a first hypothesis for the probability estimates at a manner which adapts to the actual symbol statistics at a first adaptation agility which is controllable by a first agility parameter, at the beginning of the bitstreams and/or at one or more entry points within the bitstream, set, for each of the set of one or more context models, the first hypothesis and the first agility parameter associated with the respective context model according to the context model information signaled in the bitstream.

According to an embodiment, the arithmetic encoder is configured to adapt the probability estimates of the plurality of context models to actual symbol statistics using previously encoded symbols of the sequence of symbols by deriving a second hypothesis for the probability estimates at a manner which adapts to the actual symbol statistics at a second adaptation agility which is controllable by a second agility parameter and forming an average of the first and second hypothesis, at the beginning of the bitstream and/or at one or more entry points within the bitstream, set, for each of the set of one or more context models, the second hypothesis and the second agility parameter associated with the respective context model according to the context model information signaled in the bitstream.

According to an embodiment, wherein the context model information in the bitstream comprises a table entry index into a table of quadruples of values for defining the first and second hypotheses and the first and second agility parameters, and the arithmetic encoder is configured to use the table entry index so as to select one quadruple of the table and to use the one quadruple so as to set the first and second hypotheses and the first and second agility parameters.

According to an embodiment, a number of the quadruples of values for defining the first and second hypotheses and the first and second agility parameters lies between 8 and 10, both inclusively. See the table below where nine lines/ quadruples exist.

According to an embodiment, the quadruples of values for defining the first and second hypotheses and the first and second agility parameters correspond to one of 3, 4 or 5 mutually distinguishable settings for the first and second agility parameters. See the table below where (1,4), (2,6), (0,5) or (3,5) exist.

According to an embodiment, the quadruples of values for defining the first and second hypotheses and the first and second agility parameters comprise first 3 quadruples (e.g., cp. 1,4,0,0, 1,4,95,1519 and 1,4,−41,−654) according to all of which the first agility parameter is set to a first value, the second agility parameter is set to a second value, which corresponds to lower adaptation agility than the first value, and according to a first one of which the first and second hypotheses correspond to equi-probability, according to a second one of which the first and second hypotheses correspond to a first bin value being more probable than a second bin value, and according to a third one of which the first and second hypotheses correspond to the second bin value being more probable than the first bin value, second 3 quadruples (e.g., cp. 2,6,95,1519, 2,6,30,482 and 2,6,−21,−337) according to all of which the first agility parameter is set to a third value, which corresponds to lower adaptation agility than the first value, and larger adaptation agility than the second value, and the second agility parameter is set to a fourth value, which corresponds to lower adaptation agility than the second value, and according to a first and second one of which the first and second hypotheses correspond to the first bin value being more probable than the second bin value, and according to a third one of which the first and second hypotheses correspond to the second bin value being more probable than the first bin value, 2 quadruples (e.g., cp. 3,5,0,0 and 3,5,30,482) according to all of which the first agility parameter is set to a fourth value, which corresponds to lower adaptation agility than the third value, and larger adaptation agility than the second value, and the second agility parameter is set to a sixth value, which corresponds to lower adaptation agility than the second value, and larger adaptation agility than the fourth value, and according to a first one of which the first and second hypotheses correspond to equi-probability, and according to a second one of which the first and second hypotheses correspond to the first bin value being more probable than the second bin value, 1 quadruple (e.g., cp. 0,5,0,0) according to which the first agility parameter is set to a seventh value, which corresponds to larger adaptation agility than the first value, and according to which the first and second hypotheses correspond to equi-probability.

According to an embodiment, the symbols are bins and the symbolization is a binarization and the arithmetic encoder is configured to adapt the probability estimates of the plurality of context models to actual symbol statistics using previously encoded symbols of the sequence of symbols by, for each of the first and second hypotheses, representing the respective hypothesis by means of a singed integer, respectively, which, when being zero, is indicative of equi-probability, which, when being larger than zero, is indicative of a first bin value being more probable than a second bin value, and which, when being lower than zero, is indicative of the second bin value being more probable than the first bin value, for each context model, increase the singed integer if a currently encoded bin has the first bin value, and decrease the singed integer if a currently encoded bin has the second bin value, at an amount which is controlled by the first agility parameter with respect to the first hypothesis and controlled by the second agility parameter with respect to the second hypothesis so that the amount is the larger the smaller the first and second agility parameter is, respectively, wherein the probability estimates are determined by an average of the first and second singed integers.

According to an embodiment, the arithmetic encoder is configured to determine the amount for the increase and decrease by use of a transition table.

According to an embodiment, the arithmetic encoder is configured to use the same transition table for the first and second hypotheses.

According to an embodiment, the arithmetic encoder is configured to determine the amount for the increase and decrease by use of the transition table by looking up the transition table at an entry indexed by a table index determined by the signed integer to obtain a transition step and dividing the transition step size by 2 to a power which depends on the first and second adaptation parameter, respectively, wherein the transition step determines the amount.

According to an embodiment, o the signed integer is represented by a 2's-complement representation with n bits, with n being larger for the second hypothesis than for the first hypothesis (8 and 12 in the example below in the detailed description; that is, the "scale" for second hypothesis is larger/finer as compared to the first hypothesis so that the agility is reduced if the transition steps were the same), wherein the arithmetic encoder is configured to determine the amount for the increase and decrease by use of the transition table by looking up the transition table at an entry indexed by a sum of the signed integer divided by $2^{n-m}$ on the one hand and $2^{m-1}$ on the other hand (m=5 in the example below in the detailed description) in case to obtain a transition step dividing (thus, the adaptation steps which determine adaptation agility are determined by agility parameter) the transition step size by 2 to a power which affine linearly (4+shift0 and shift1, respectively) depends on the first and second adaptation parameter, respectively, wherein the transition step determines the amount. The dependency may be such that the agility was the same between first and second hypotheses if first and second agility parameter were the same; above this is done by "4+", i.e. by adding the difference of n between first and second hypotheses to the agility parameter of the first hypothesis.

According to an embodiment, the transition steps are stored in the entries of the transition table increase or decrease monotonically.

The arithmetic encoder, the arithmetic decoder, the method of arithmetically encoding, the method for arithmetically decoding, the computer program for implementing these methods, the arithmetic encoder for arithmetically encoding neural network parameters and a bitstream may optionally be supplemented by any of the features, functionalities and details disclosed herein (in the entire document), both individually and taken in combination.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
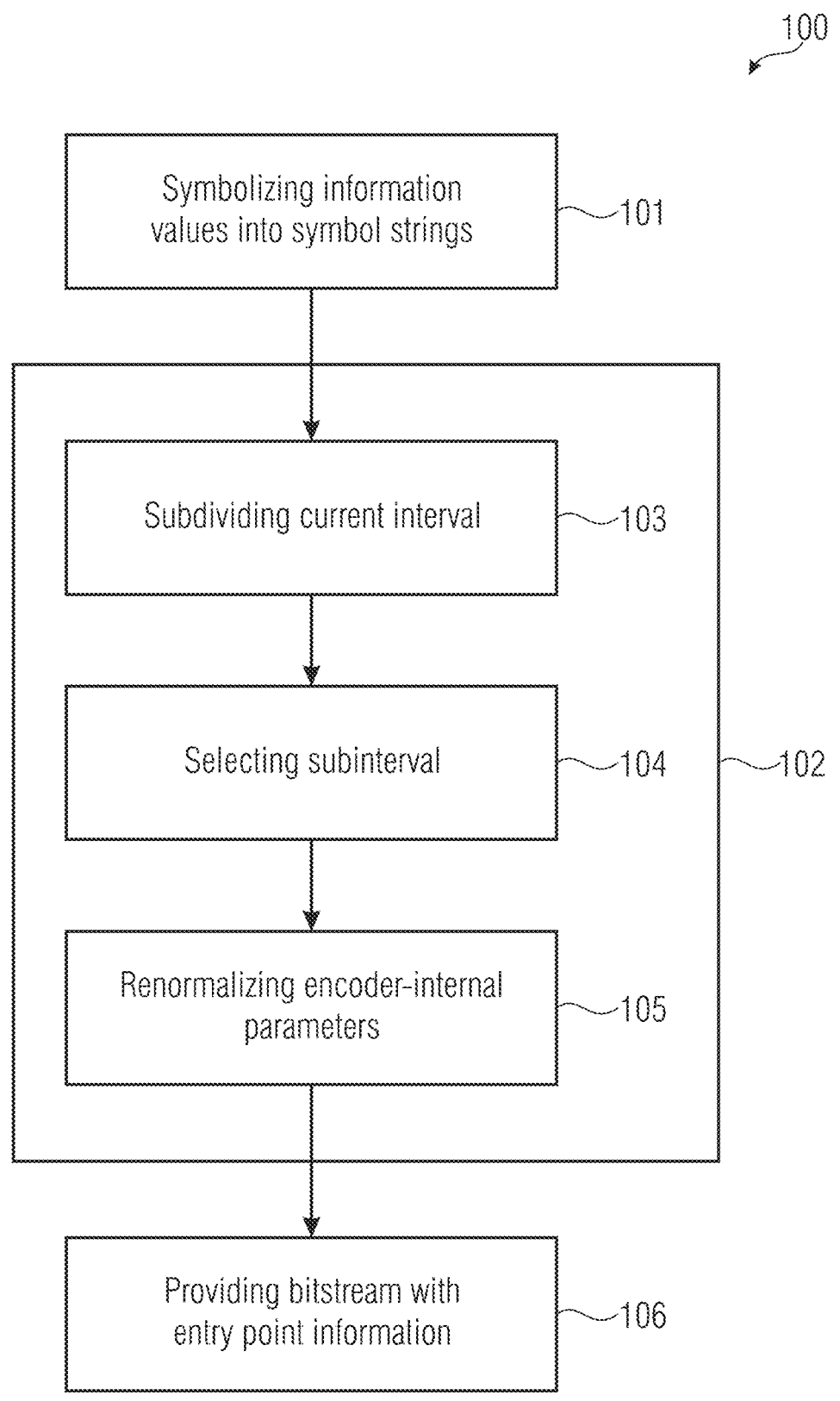
FIG. 1 shows a flow chart of a method 100 for encoding in accordance with an embodiment.

A method 100 of arithmetically encoding a sequence of integer values into an arithmetic coded bitstream in accordance with an embodiment is presented in FIG. 1.

The method comprises symbolizing at step 101 the information values into symbol strings so as to obtain a sequence of symbols and arithmetically encoding at step 102 the sequence of symbols.

The arithmetically encoding comprises subdividing at step 103 a current interval, which defines a current version of an coding state of an arithmetic encoder, for each symbol, according to a probability estimate for the respective symbol. The arithmetically encoding further comprises selecting at step 104 a subinterval out of a plurality of the subintervals according to a symbol value of the respective symbol. An updated version of the coding state of the arithmetic encoder, defined by the selected subinterval, is thus obtained, which is further used for encoding a next symbol of the sequence of symbols. The arithmetically encoding further comprises renormalizing at step 105 encoder-internal parameters which define the coding state under continuing the bitstream.

After performing the arithmetically encoding the method 100 further provides at step 106 the bitstream with entry point information allowing for resuming arithmetic decoding the bitstream from a predetermined entry point onward.

However, it should be noted that the method 100 may optionally be supplemented by any of the features, functionalities and details disclosed herein, both individually or taken in combination.

Figure 2:
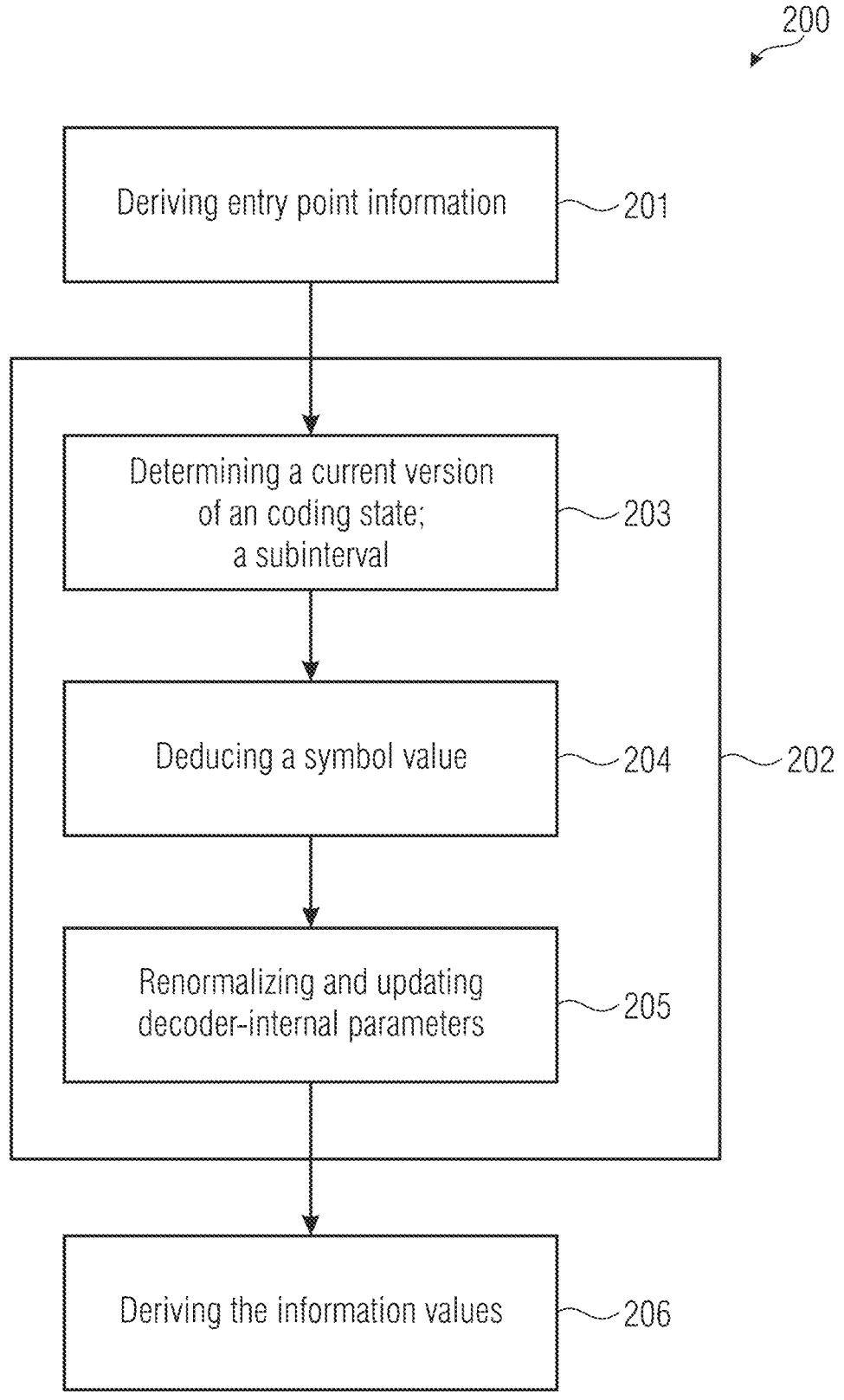
FIG. 2 shows a flow chart of a method 200 for decoding in accordance with an embodiment.

A method 200 of arithmetically decoding a sequence of information values from a bitstream in accordance with an embodiment is presented in FIG. 2.

The method comprises deriving at step 201 entry point information from the bitstream and using at step 202 the entry point information so as to resume arithmetically decoding the bitstream from a predetermined entry point onward by arithmetically decoding a sequence of symbols from the bitstream, for each symbol of the bitstream. The arithmetically decoding the sequence of symbols from the bitstream comprises determining at step 203, a current version of an coding state of an arithmetic decoder and a subinterval out of a plurality of subintervals into which a current interval is subdivided according to a probability estimate for the respective symbol. The arithmetically decoding further comprises deducing at step 204, based on the selected subinterval, a symbol value of the respective symbol. The arithmetically decoding further comprises renormalizing and updating at step 205 decoder-internal parameters which define the coding state by use of the bitstream and the selected subinterval so as to obtain an updated version of the coding state of the arithmetic decoder for decoding a next symbol of the sequence of symbols.

After performing the arithmetically decoding the method 200 further derives at step 206 the information values from the sequence of symbols by desymbolization.

However, it should be noted that the method 200 may optionally be supplemented by any of the features, functionalities and details disclosed herein, both individually or taken in combination.

Figure 3:
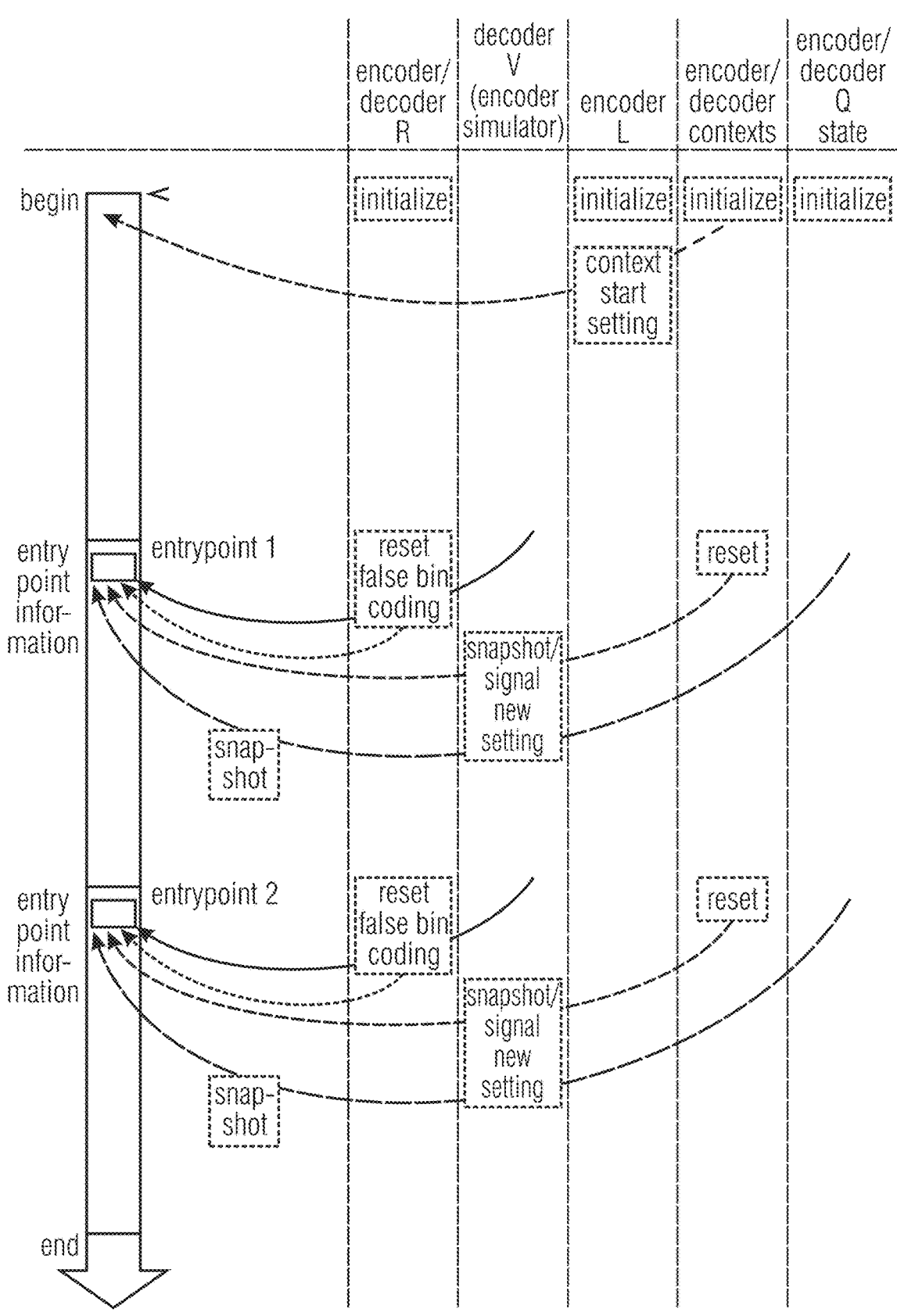
FIG. 3 shows a schematic representation of encoding and decoding parameters occurring during encoding and decoding an arithmetic bitstream with illustrating different possibilities as to what may be signaled as entry point information in the bitstream in accordance with embodiments.

FIG. 3 is a schematic representation of encoding and decoding parameters as developing during encoding and decoding, with illustrating as to what could be signaled as entry point information in the bitstream to be used in the decoding process.

At the beginning of the encoding and decoding at the begin of the bitstream or at a leading end from which onwards the bitstream is to be decoded completely the following variables might be initialized in a default manner: interval width R both at encoder and decoder, interval offset L at the encoder, a state of context model (optionally if context adaptivity applies) both at encoder and decoder and, optionally, a quantization state (if dependent quantization is used). The pointer V might be going to be derived by the decoder from the first few bits in the bitstream. From the beginning inwards, the parameters develop and a decoder would have to perform the whole decoding process to know as to which states occur at any entry point. According to embodiments, the encoder assumes responsibility to generate this information and convey such information along with the bitstream to the decoder so that the latter might directly commence decoding at one of the entry points.

Each of the entry points of the bitstream could be seen as a snapshot of the state of the arithmetic encoder or, to be more precise, of an arithmetic decoding process run in the encoder to simulate that state at encoder site. Particularly, the entry points of the bitstream are quasi indicative of a snapshot of states of context models or a quantization state of the decoding process as occurring during decoding the bitstream in question. The indicated variables are thus signaled in the bitstream for the predetermined entry points. They might be signalled in a header preceding the bitstream, following the bitstream or inserted inbetween such as at the entry points themselves. Parts of the parameters needed for decoding might be set at encoder and decoder in a synchronous manner at the entry points, so that no information thereabout needs to be included in the entry point information.

In the following, an embodiment is described for arithmetically encoding a sequence of information values into an arithmetic coded bitstream, e.g. in a bitstream containing encoded neural network data, e.g. in a NNR bitstream. Entry point information allowing for resuming arithmetic decoding the bitstream from a predetermined entry point onward is shown in Table 1 in form of a pseudo code. Naturally, the details set out herein also reveal a corresponding arithmetic decoding of the thus generated bitstream.

TABLE 1

| | |
|---|---|
| for j=0; j < NumBlockRowsMinus1; j++ ) { | |
| cabac_offset_list[ j ] | u(8) |
| if( dq_flag ) | |
| dq_state_list[ j ] | u(3) |

TABLE 1-continued

```
    if( j == 0 ) {
        bit_offset_delta1                              ue(11)
        BitOffsetList[ j ] = bit_offset_delta1
    }
    else {
        bit_offset_delta2                              ie(7)
        BitOffsetList[ j ] = BitOffsetList[ j-1 ] +
bit_offset_delta2
    }
}
```

According to FIG. 1, the information values are symbolized into symbol strings so as to obtain a sequence of symbols, which are arithmetically encoded by, for each symbol, selecting a subinterval out of a plurality of subintervals into which a current interval, which defines a current version of an coding state of the arithmetic encoder, is subdivided according to a probability estimate for the respective symbol, the selection being done according to a symbol value of the respective symbol, so as to obtain an updated version of the coding state of the arithmetic encoder, defined by the selected subinterval, for encoding a next symbol of the sequence of symbols, and renormalizing encoder-internal parameters which define the coding state under continuing the bitstream.

The bitstream is provided with entry point information allowing for resuming arithmetic decoding the bitstream from a predetermined entry point onward.

As could be seen in Table 1, the entry point information allowing for resuming arithmetic decoding the bitstream from a predetermined entry point onward includes:

cabac_offset_list, which specifies a list of values to be used to initialize variable IvlOffset at the beginning of entry points. It is exemplarily shown to be coded as a 8-bit unsigned integer, but it could also be coded differently; in this example, variables IvlCurrRange and IvlOffset are used to define the status of the arithmetic decoding engine, or the coding state; that is, the coding state of the arithmetic decoder is defined by decoder-internal parameters including an interval width parameter indicating a width of the interval and a pointer pointing into the interval; here, IvlCurrRange denotes the width of the interval and IvlOffset indicates the pointer into the interval.

dq_state_list specifies a list of values to be used to initialize variable stateId at the beginning of entry points. It is exemplarily shown to be coded as a 3-bit unsigned integer, but it could also be coded differently; stateId is used here as a variable denoting the state of the state machine used to perform dependent quantization.

bit_offset_delta1 specifies the first element of list BitOffsetList. It is exemplarily shown to be coded using an unsigned 11-th order Exp-Golomb code, but it could also be coded differently;

bit_offset_delta2 specifies elements of list BitOffsetList except for the first element, as difference to the previous element of list BitOffsetList. It is exemplarily shown to be coded using a signed 7-th order Exp-Golomb code;

Variable BitOffsetList is a list of bit offsets to be used to set the bitstream pointer position at the beginning of entry points.

To be more precise, Table 1 relates to an embodiment where dependent quantization is used for deriving the sequence of information values from a sequence of unquantized values, namely using a state machine, wherein the entry point information comprises a quantization state manifesting itself in the state machine up to the predetermined entry point, namely stateId.

The manner at which the arithmetic decoding the bitstream from a predetermined entry point onward is launched using the entry point information in Table 1 is exemplarily shown in Table 2 in form of a pseudo code.

TABLE 2

```
if( entryPointOffset == -1 &&
        GetEntryPointIdx( dimensions, i, scan_order != -1 &&
        scan_order > 0 ) {
    IvlCurrRange = 256
    j = entryPointOffset +
        GetEntryPointIdx( dimensions, i, scan order )
    IvlOffset = cabac_offset_list[ j ]
    if ( dq_flag )
        stateId = dq_state_list[ j ]
    set_bit_pointer( bitpointer + lastOffset + BitOffsetList[ j ] )
    lastOffset = BitOffsetList[ j ]
    init_prob_est_param( )
}
```

In Table 2, a variable entryPointOffset is used to indicate whether entry points are present for decoding and, if entry points are present, an entry point offset. GetEntryPointIdx (tensorDimensions[ ], i, scan) returns −1 if index i doesn't point to the first position of an entry point. If index i points to the first position of an entry point, it returns the entry point index within the tensor.

GetEntryPointIdx(tensorDimensions[ ], i, scan) returns −1 if index i doesn't point to the first position of an entry point. If index i points to the first position of an entry point, it returns the entry point index within the tensor. To determine the positions and indexes of entry points, the following applies:

A variable $w$ is set to $Prod(\text{tensorDimensions})/\text{tensorDimensions}[0]$ A variable $epIdx$ is set to $i/(w*(4<<\text{scan}))-1$ If i>0 and i % (w*(4<<scan)) is equal to 0, index i points to the first position of an entry point and the entry point index is equal to epIdx.

Otherwise, index i doesn't point to the first position of an entry point.

dq_flag specifies whether the quantization method is dependent scalar quantization or uniform quantization. A dq_flag equal to 0 indicates that the uniform quantization method is used. A dq_flag equal to 1 indicates that the dependent scalar quantization method is used. If dq_flag is not present, it is inferred to be 0.

set_bit_pointer sets the position of the bitstream pointer. init_prob_est_param( ) invokes the initialization process for probability estimation parameters.

scan_order specifies the block scanning order for parameters with more than one dimension according to the following table:

0: No block scanning
1: 8×8 blocks
2: 16×16 blocks
3: 32×32 blocks
4: 64×64 blocks That is, in the example provided by Table 1 and 2, the entry point information comprises a bitstream pointer to a predetermined bit in the bitstream, which is up to be read next after the resuming the arithmetic decoding the bitstream from the predetermined entry point onwards, namely set_bit_pointer. Here, the entry point information allows for resuming arithmetic decoding the bitstream from more than one entry point onward, namely for NumBlockRowsMinus1 entry points. Entry points might be defined to be positioned between row changes when scanning a tensor row wise or regularly by scanning one dimension completely before scanning the next row along that dimension and so forth. The bitstream pointer to the predetermined bit in the bitstream is signaled in the bitstream in form of an offset relative to a previous entry point as derivable from the addition in BitOffsetList[j]=BitOffsetList[j−1]+bit_offset_delta2 in Table 1.

At each entry point j, the coding state is initialized using cabac_offset_list [j] and dq_state_list [j] with respect to interval pointer and dependent quantization state, respectively. In accordance with this embodiment here, the interval width is set to a constant or predefined fixed value at each entry point, i.e. an default value, namely here exemplarily 256, wherein IvlCurrRange and IvlOffset are both in 16 bit register precision in this example. The latter explicit bit precisions are, however, merely examples and could be varied.

FURTHER EMBODIMENTS AND ASPECTS

In the following, further aspects and embodiments according to the invention will be described, which can be used individually or in combination with any other embodiments disclosed herein.

Moreover, the embodiments disclosed in this section may optionally be supplemented by any other features, functionalities and details disclosed herein, both individually and taken in combination.

Entry point structures for arithmetic coding in accordance with an embodiment of the invention are further described.

BACKGROUND

Context-based adaptive binary arithmetic coding (CABAC) is a method for encoding and decoding a sequence of symbols. A binarization stage converts each symbol of such a sequence into a sequence of one or more binary symbols (bins) and the concatenation of these bin sequences is arithmetically encoded into a bitstream. A context modeling stage associates a probability estimate with each bin for arithmetic coding based on previously encoded bins and context information. The decoder has the same information available and can reproduce the same probability estimates in order to carry out arithmetic decoding.
Review of the Binarization Stage and the Context Modeling Stage of CABAC Binarization and context modeling strongly depends on the application. For example, the video compression standards H.265/HEVC and H.266/VVC both employ CABAC as arithmetic coding engine but have very different binarization and context modeling stages as they are tuned to the types of syntax elements that occur. However, most applications that employ CABAC maintain a set of so-called context models and binarization and context modeling corresponds to associating each bin unambiguously to a particular context model from this set. A context model is usually implemented as backward-adaptive probability estimator that only takes bins into account that were previously associated with the context model.

In the following, three examples for different concepts of implementing context models in accordance with an embodiment of the invention are reviewed:

| Identifier | HEVC | VVC | NNR |
|---|---|---|---|
| Notes | Used in the H.265/HEVC video compression standard | Used in the H.266/VVC video compression standard | Used in the committee draft of the ISO/IEC 15938 Part 17 standard for compression of nueral networks (this document contains some incorrect equations, see note below the table) |
| State variables | A 7 bit unsigned integer | A 10 bit and a 14 bit unsigned integer | An 8 bit and a 12 bit signed integer |
| State to probability mapping | logarithmic | linear | Logarithmic |
| Number of adaptation rate variables | — | 2 | 2 |

Details about the implementations can be found in the respective resources in row "Notes".
Note:
The committee draft of the ISO/IEC 15938 Part 17 standard contains some incorrect equations in the description of the probability estimator, which need to be corrected as follows in order to yield the correct "NNR" context model implementation:
In section 11.3.4.3.2.1, equation "valMps = pStateIdx0 + pStateIdx0 >= 0" has to be replaced with "valMps = 16 * pStateIdx0 + pStateIdx1 >= 0".
In section 11.3.4.3.2.1, equation "ivlLpsRange = rps_table[(abs(pStateIdx0 + pStateIdx1) >> 7)) + qRangeIdx]" has to be replaced with "IvlLpsRange = rps_table[(abs(16 * pStateIdx0 + pStateIdx1) >> 7)) + qRangeIdx]".
In section 11.3.4.3.2.2, equation "pStateIdx0 += sign * (transition_table[16 + (sign * pStateIdx0 >> 3)] >> shift0)" has to bereplaced with "pStateIdx0 +=sign * (transition_table[16 + (sign * pStateIdx0 >> 3)] >> (4 + shift0))".
In section 11.3.4.3.2.2, equation "pStateIdx1 += sign * (transition_table[16 + (sign * pStateIdx0 >> 7)] >> shift1)" has to be replaced with "pStateIdx1 +=sign * (transition_table[16 + (sign * pStateIdx1 >> 7)] >> shift1)".

According to an embodiment of the invention, only the variables that represent the state of a context model are of interest as the probability estimation processes are not changed. Note that the present embodiments of the invention can also be applied to other types of probability estimators that are not described here.

Furthermore, in embodiments of the invention there may exist bins that are not associated with context models like the well-known bypass bins or terminating bins.

Detailed review of the probability estimator in accordance with an embodiment of the invention of the committee draft of the ISO/IEC 15938 Part 17 standard.

Each context model maintains, for example, four variables shift0, shift1, pStateIdx0, and pStateIdx1. The variables pStateIdx0 and pStateIdx1 are signed 8 and 12 bit integers, respectively, in two's complement representation.

A probability estimate for arithmetic encoding or decoding can be derived, for example, from pStateIdx0 and pStateIdx1 and from the width of the current coding interval IvlCurrRange of the arithmetic encoder or decoder, which is a value in the interval [256, 510], as follows:

$$valMps = 16 * pStateIdx0 + pStateIdx1 >= 0$$

$$qRangeIdx = ivlCurrRange \ \& \ 0 \times e0$$

$$rlps\_table = [128, 112, 97, 84, 74, 65, 57, 50, 45, 39, 34, 30, 27, 23,$$

$$20, 18, 15, 14, 12, 11, 10, 9, 7, 7, 5, 5, 4, 4, 3, 3, 2, 2, 142, 125,$$

$$108, 93, 82, 72, 63, 56, 50, 43, 38, 33, 30, 26, 22, 20, 17, 16, 13, 12,$$

$$11, 10, 8, 8, 6, 6, 5, 5, 3, 3, 2, 2, 156, 137, 119, 103, 90, 79, 70, 61,$$

-continued 55, 48, 42, 37, 33, 28, 24, 22, 19, 17, 15, 13, 12, 11, 9, 9, 6, 6, 5, 5, 4, 4, 2, 2, 171, 150, 130, 112, 99, 87, 76, 67, 60, 52, 46, 40, 36, 31, 27, 24, 21, 19, 16, 15, 13, 12, 10, 10, 7, 7, 6, 6, 4, 4, 3, 3, 185, 162, 141, 121, 107, 94, 82, 73, 65, 56, 50, 43, 39, 34, 29, 26, 22, 21, 17, 16, 14, 13, 11, 11, 8, 8, 6, 6, 4, 4, 3, 3, 199, 175, 152, 131, 115, 101, 89, 78, 70, 61, 54, 47, 42, 36, 31, 28, 24, 22, 19, 17, 15, 14, 12, 12, 8, 8, 7, 7, 5, 5, 3, 3, 213, 187, 163, 140, 123, 108, 95, 84, 75, 65, 58, 50, 45, 39, 33, 30, 26, 24, 20, 18, 16, 15, 13, 13, 9, 9, 7, 7, 5, 5, 3, 3, 228, 200, 174, 150, 132, 116, 102, 90, 80, 70, 62, 54, 48, 42, 36, 32, 28, 26, 22, 20, 18, 16, 14, 14, 10, 10, 8, 8, 6, 6, 4, 4]

*ivlLpsRange =*

$$\text{rps\_table}[(\text{abs}((16 * pStateIdx0 + pStateIdx1) >> 7)) + qRangeIdx]$$

Variable valMps is the value of the more probable symbol (MPS) and the probability estimate of the less probable symbol (LPS) is given as $p_{LPS}$=ivlLpsRange/ivlCurrRange. Accordingly, the probability estimate of the more probable symbol is simply $p_{MPS}$=1−$p_{LPS}$.

The probability Pr(bin==1) of the next bin being equal to 1 can be derived, for example, as follows:

$$\text{If } valMps == 1: Pr(bin == 1) = p_{MPS}$$

$$\text{Otherwise (if } valMps == 0): Pr(bin == 1) = p_{LPS}$$

Note that these probability estimates don't directly occur in the encoder or decoder as only the subinterval widths associated with the MPS and LPS are needed for arithmetic encoding or decoding.

At the beginning of the encoding, pStateIdx0 and pStateIdx1 are both set to 0 which approximately corresponds to $p_{LPS}$=0.5.

After encoding or decoding of a bin with value binVal, pStateIdx0 and pStateIdx1 are updated, for example, according to the following equations using variables shift0 and shift1:

$$\text{transition\_table} = [2512, 2288, 2064, 1840, 1616,$$
$$1392, 1168, 944, 720, 560, 464, 368, 272, 208, 144, 80,$$
$$64, 64, 64, 64, 64, 64, 64, 64, 64, 64, 64, 64, 64, 64, 64, 0]$$

$$\text{sign} = 2 * binVal - 1$$

$$pStateIdx0 +=$$
$$\text{sign} * (\text{transition\_table}[16 + (\text{sign} * pStateIdx0 >> 3)] >> (4 + shift0))$$
$$pStateIdx1 +=$$
$$\text{sign} * (\text{transition\_table}[16 + (\text{sign} * pStateIdx1 >> 7)] >> shift1)$$

As can be seen from the equations, larger values for shift0 or shift 1 lead to a smaller modification of the values of pStateIdx0 or pStateIdx1, respectively, which corresponds to a smaller change in the resulting probability estimate while smaller values correspond to larger changes. Consequently, shift0 and shift1 can be seen as agility parameters that control the update agility of pStateIdx0 and pStateIdx1.

Typical values for (shift0, shift1) are, for example, (1, 4), (0, 0), (0, 5), (1, 1), (1, 2), (2, 4), (2, 6), (3, 4), or (3, 5) and it depends on the statistical properties of the sequence of bins to be encoded which values are most appropriate for shift0 and shift1.

The underlying principle is known as exponentially weighted moving averages (EWMA).

Review of the arithmetic coding engine of CABAC (M coder) in accordance with an embodiment of the invention is further described.

The M coder in accordance with an embodiment maintains in the decoder two unsigned B bit integer variables V and R. Typically, B is set to 9 but other choices are also possible. At the beginning of the decoding, V is initialized with the first B bit of the arithmetically encoded bitstream (advancing the bitstream pointer by B bits) and R is set to an initial value like e.g. $2^B$−2. Note that the bitstream may contain further bits before arithmetic encoding starts such as high-level syntax. R represents the width of the current coding interval and it may only contain values in the interval $[2^{B-1}, 2^B-1]$. The coding interval is given as [0, R] and V represents a pointer into the coding interval, i.e., V<R has to hold. For decoding of a bin b, a probability for the two possible values of b is estimated employing well-known techniques like context modeling and probability estimation like e.g. exponentially weighted moving averages (EWMA). Based on the estimated probability associated with bin b, two subintervals $I_L$=[0, $R_L$] and $I_R$=[$R_L$, R] are derived where $I_L$ is associated with one possible value of bin b and $I_R$ is associated with the other possible value of bin b. For example, $I_R$ is usually associated with the less probable symbol (LPS) based on the estimated probability while $I_L$ is associated with the more probable symbol (MPS).

Decoding of a bin is carried out, for example, as follows (enumerated lists correspond to ordered steps):

If V<$R_L$:
1. The symbol value associated with $I_L$ is the decoded value of b.
2. R is set to $R_L$.

Otherwise (V>=$R_L$):
1. The symbol value associated with $I_R$ is the decoded value of b.
2. R is set to R−$R_L$.
3. V is set to V−$R_L$.

If afterwards R<$2^{B-1}$, renormalization is carried out, for example, as follows:
1. R is set to 2*R
2. V is set to 2*V+ReadOneBit( )
3. If R<$2^{B-1}$, continue with step 1 (otherwise renormalization is done).

Function ReadOneBit( ) returns the next bit in the bitstream and advances the bitstream pointer by 1 bit.

The above bin decoding procedure is also known as regular coding mode. Furthermore, there exists the well-known bypass coding mode and the terminating bin coding mode.

Concept in accordance with an embodiment of the invention is further described.

Arithmetic decoding is a sequential process that can hardly be parallelized. The concept in accordance with an embodiment of the invention introduces a method for enabling a decoder to start decoding at predefined positions in the bitstream by defining so-called entry points. In this way, several decoders can operate in parallel decoding different parts of a single bitstream (starting at different entry points).

Entry Points

An entry point can be seen as a snapshot of the state of the arithmetic decoder before decoding a particular bin. I.e., it consists of the following variables:

a. R b. V c. Pointer to the next bit in the bitstream d. State of the CABAC decoder (e.g. states of context models and potentially further relevant variables like the state of a dependent quantization scheme)

Such an entry point would need B–1 bits for R (for representing all possible values in the interval $[2^{B-1}, 2^{B-1}]$), B bits for V and further bits for storing c. and d. For storing c., it may be appropriate in an embodiment to employ a variable length code, like an Exponential-Golomb code because small pointer values would result in short binary codewords. Storing d. may, however, need a huge number of bits because there could be a large number of context models and each context model might need several bits to represent its internal state.

Remarkably, an entry point can also be created in an embodiment for existing CABAC bitstreams without a need to re-encode the bitstream.

In an embodiment, one or more entry points have been generated for a CABAC bitstream. For the first entry point, the pointer to the next bit in the bitstream c. is stored as difference between the bit position where arithmetic decoding starts and the bit position of the first entry point.

In another embodiment, this difference is further reduced by B (as the first B bits are loaded into V during the initialization of the arithmetic decoder).

In another embodiment, all entry points after the first entry point (if present) store the pointer to the next bit in the bitstream c. relative to the pointer to the next bit in the bitstream c. of the previous entry point. For example, the difference between the pointers to the next bit in the bitstream c. of the current entry point and the previous entry point is stored.

In another embodiment, the integer value to be stored indicating the pointer to the next bit in the bitstream c. (for example, given as a difference as described in the previous preferred embodiments) is encoded in the bitstream using an unsigned Exponential-Golomb code (which e.g. corresponds to data type ue(k) as defined in the committee draft of ISO/IEC 15938 Part 17) of order k.

In another embodiment, the pointers to the next bit in the bitstream c. involved in the calculation of an integer that represents the next bit in the bitstream c. (as described in the previous preferred embodiments) are rounded down to multiples of 8 before carrying out the calculation. The resulting difference is therefore also a multiple of 8 and can be divided by 8 yielding a byte offset (instead of a bit offset). Furthermore, 3 additional bits are encoded in an entry point, indicating the bit position in the current byte of the current entry point.

In an embodiment, encoding and decoding involves the well-known dependent quantization scheme (like e.g. used in the committee draft of ISO/IEC 15938 Part 17) where a state variable is maintained. A fixed number of bits is stored with each entry point to indicate the value of the dependent quantization state. For example, for the committee draft of ISO/IEC 15938 Part 17, a 3 bit variable is stored indicating one of the 8 possible values of the dependent quantization state.

Double differential signaling of the pointer to the next bit in the bitstream c in accordance with an embodiment is further described.

In an application where the entry points are located roughly equally distant in the bitstream, the differences between pointers to the next bit in the bitstream c. between neighboring entry points have roughly the same value. In such a situation, it may be more efficient to signal "differences of differences" of these bit positions for all except the first two entry points. More precisely, consider three neighboring entry points ep1, ep2, and ep3 with associated pointers to the next bit in the bitstream c. given as bitPos1, bitPos2, and bitPos3, respectively. Furthermore, assume that bitPos1<bitPos2<bitPos3 holds. Then, for roughly equally spaced entry points ep1, ep2, and ep3, the differences d1=bitPos2−bitPos1 and d2=bitPos3−bitPos2 have roughly the same value. I.e., the difference of differences d2−d1 has a small magnitude. Therefore, in an embodiment, the position of the next bit in the bitstream c. for entry point ep3 is signaled as "double difference" dd3=d2−d1. Note that dd3 can now also be negative. As the magnitude of dd3 tends to be smaller than the magnitude of d3, it may be possible to signal it with less bits in the bitstream when, for example, using a signed exponential Golomb code.

In another embodiment, difference d1, indicating the position of the next bit in the bitstream c. of entry point ep2, is signaled as unsigned exponential Golomb code with parameter k=11.

In another embodiment, difference dd3, indicating the position of the next bit in the bitstream c. of entry point ep3 (represented as "double difference" as discussed above), is signaled as signed exponential Golomb code with parameter k=7.

In another embodiment, differential and/or double differential values (as described above), indicating positions of the next bit in the bit stream c. are calculated based on entry points that are not encoded in the bitstream but, instead, derived by encoder and decoder at predetermined positions. For example, the first entry point ep1 is not signaled in the bitstream (instead, derived in the encoder and decoder), but used to calculate differences or double differences for signaling ep2.

Entry points with encoder modifications in accordance with an embodiment of the invention are further described.

As discussed in the previous section, storing d. in an entry point may need a substantial number of bits. In this section, several concepts are described that reduce the size of an entry point by allowing encoder modifications.

Modifications to the state of the CABAC encoder and decoder (d.) in accordance with embodiments are further described.

In accordance with an embodiment, the state of the CABAC encoder and decoder d. is set to predefined values at the beginning of an entry point. Consequently, it is not necessary to store d. in an entry point. However, this may result in a larger arithmetically encoded bitstream as the probability modeling accuracy is reduced.

For example, the state of the CABAC encoder and decoder at the beginning of an entry point could be set according to one of the following rules (each one in accordance with an embodiment):

1. The state of the CABAC encoder and decoder is reset to default values.

2. The state of the CABAC encoder and decoder is initialized using information that is signaled in the bitstream.

3. The state of the CABAC encoder and decoder is set to a previously saved state of the CABAC encoder and decoder.

Recall that the state of a CABAC encoder and decoder may consist of a set of context models and on further variables. It usually makes sense to apply different rules to different parts of the state of the CABAC encoder and decoder. For example, in accordance with an embodiment, rule 1 could be applied to the context models while applying no rule at all might be more suitable for other variables like the state of a dependent quantization scheme. I.e., the other variables are stored with the entry point. Or in another example, in accordance with an embodiment, rule 1 or rule 2 is applied to a first subset of the context models while rule 2 or rule 3 is applied to a second (disjoint) subset of context models.

Examples based on rule 1 in accordance with an embodiment are:

Rule 1 is possibly the simplest method of avoiding the need to store d. with an entry point. However, it may also result in a substantially increased arithmetically coded bitstream as the probability modeling accuracy is strongly reduced.

Examples based on rule 2 in accordance with an embodiment are:

Rule 2 can, for example be applied to context models only while other rules (or no rule) can be applied to all other variables (if any) that are associated with the state of the CABAC encoder and decoder (like e.g. the state of a dependent quantization scheme). For example, initialization for some or all context models can be signaled in the bitstream somewhere before the first entry point. At the beginning of each entry point this initialization information is used to derive initial states for each context model.

Examples based on rule 3 in accordance with an embodiment are:

Storing and loading states of a context model is, for example, known from the context of wavefront parallel processing of the video compression standard H.265/HEVC. The encoder and decoder store the states of context models at predefined positions and have them available to load these states at other predefined positions. This concept can be combined with the entry point concept where saved context model states are loaded at the beginning of an entry point.

Modifications to variable R in the CABAC encoder and decoder in accordance with embodiment are further described.

The variable R is in the range $[2^{B-1}, 2^B-1]$. Consequently, storing R in an entry point needs B−1 bit (because there are $2^B-1-2^{B-1}+1=2^{B-1}$ values in the interval). Signaling R in an entry point can be avoided in an embodiment by encoding and decoding a so-called pseudo-bin before creating an entry point. This is done by using the encoding procedure for a regular bin with $R_L$ set to $2^{B-1}$ and with selecting the symbol value associated with $I_L$ as the encoded or decoded symbol. Note that such a pseudo-bin is only needed if $R>2^{B-1}$. After such a pseudo-bin, the variable R is $2^{B-1}$ and therefore, it needs not to be stored in an entry point which saves B−1 bits. As the pseudo bin is the more probable symbol (MPS), it produces an average portion of bits in the bit stream that is less than 1 bit which is less than the saved B−1 bits. This technique also has an impact on the possible values of variable V since V<R has to hold. Consequently, $V<2^{B-1}$ holds as well and V can be signaled in the bitstream with B−1 bits instead of B bits saving one more bit in an entry point.

In an embodiment, R is set to $2^{B-1}$ at the beginning of an entry point (in encoder and decoder) and V is stored as fixed length variable with B−1 bit.

Application of entry points to the compression of 2D arrays of values in accordance with an embodiment of the invention is further described.

Several applications encode 2D arrays of values into a bitstream. For example, image or video compression schemes encode pictures that are represented as 2D arrays of samples or compression schemes for neural network parameters reshape parameter tensors into 2D structures in order to encode the contained parameter values. Such schemes usually apply block partitioning techniques on the 2D arrays and they also define an order of the resulting blocks for encoding or decoding. Furthermore, such schemes may also contain lossy operations, like e.g. quantization, and the decoded and reconstructed 2D array is not identical to the original 2D array but usually similar (for example, in a visual sense in the case of video compression).

Consider, for example, a video or neural network parameter compression scheme that subdivides a 2D array (like an image plane or a reshaped parameter tensor) into blocks of size N×N and defines a scan order in which the blocks are ordered for encoding them into a bitstream. Such a scheme forms rows and columns of N×N blocks. For example, the order within a row could start with the left-most block and proceeding to the right. The order of the rows could simply start with the uppermost row proceeding downwards. This scan order is also known as raster scan and it could be desirable to enable the decoder to decode all rows in parallel. In this case, one entry point at the beginning of each row would be needed. Note, however, that in an embodiment a decoder might need information of neighboring blocks in order to be able to decode a current block. For example, video compression algorithms usually access information of neighboring blocks (e.g. to the left or to the top) in order to be able to decode the current block. In this case, a decoder has to further ensure that these blocks are decoded before decoding of the current block can be done.

Furthermore, parallel decoding may be useful for some 2D arrays while for others it might not be necessary. For example, for large 2D arrays it may be useful while for small 2D arrays it might not be necessary. In an embodiment, it is signaled in the bitstream whether entry points are present for a 2D array.

In an embodiment, the states of the context models (according to rule 3) are stored after the first block of each row. One entry point is generated at the beginning of each block row where the states of the context models are set to the stored values as present after encoding or decoding of the first block of the neighboring row above.

In another embodiment, the states of the context models (according to rule 3) are stored after the first block of the first row. One entry point is generated at the beginning of each block row where the states of the context models are set to the same values as present after encoding or decoding of the first block of the uppermost row.

Signaling of shared context model initialization information for entry points in accordance with an embodiment is further described.

Before the beginning of CABAC decoding, the states of all context models has to be set to predefined values. This can, for example, be default values or by using a more sophisticated context model initialization procedure. For example, the committee draft of the ISO/IEC 15938 Part 17 compression standard for neural networks (including the corrected equations as discussed above) employs two state variables per context model (pStateIdx0 and pStateIdx1) and associates a shift parameter (shift0 and shift1) with each of the state variables. The shift parameter controls the adaptation agility of the state variable update that is based on an EWMA estimator. At the beginning of the arithmetic encoding or decoding, the two state variables of each context models are set to 0, which corresponds to an initial probability estimate of 0.5. Furthermore, there exist 9 predefined value pairs for the initialization of the two shift parameters (see array ShiftParameterSet) and it is signaled in the bitstream for each context model which of the 9 value pairs is used for the shift parameters.

The effect of also distinguishing several different initialization values for the state variables of a context model is usually rather limited because the underlying EWMA estimator quickly adapts to the statistics of the bin sequence associated with a context model. However, if entry points are present and if context models are initialized at each entry point, this effect becomes more relevant. Therefore, it may be beneficial to allow a set of different values for the initialization of the state variables of a context model.

In an embodiment, a list of 4-tuples is defined, each 4-tuple representing initial values for the two state variables and the two shift parameters of a context model. In the case of NNR, the values of a 4-tuple would be associated with the 4-tuple of variables (shift0, shift1, pStateIdx0, pStateIdx1). Before arithmetic coding starts, an integer index is signaled in the bitstream for each context model, indicating which of the 4-tuples is used for initializing the respective context model.

In another embodiment, the index indicating the 4-tuple to be used to initialize a context model is signaled using a variable length code that assigns shorter code words to more frequently used 4-tuples.

For example, the following list of 4-tuples (shift0, shift1, pStateIdx0, pStateIdx1) could be used:

| Index | shift0 | shift1 | pStateIdx0 | pStateIdx1 |
|-------|--------|--------|------------|------------|
| 0 | 1 | 4 | 0 | 0 |
| 1 | 1 | 4 | −41 | −654 |
| 2 | 1 | 4 | 95 | 1519 |
| 3 | 0 | 5 | 0 | 0 |
| 4 | 2 | 6 | 30 | 482 |
| 5 | 2 | 6 | 95 | 1519 |
| 6 | 2 | 6 | −21 | −337 |
| 7 | 3 | 5 | 0 | 0 |
| 8 | 3 | 5 | 30 | 482 |

Note that the same concept can also be used with the context models of VVC where the two state variables and the two agility parameters use the same variable names as NNR (shift0, shift1, pStateIdx0, pStateIdx1). Note that these variables fulfill the same purpose in VVC as in NNR although their exact behavior is different. Therefore, the concepts presented here can also be applied to VVC when the 4-tuples are adapted appropriately.

To conclude, embodiments according to the invention provide an improved tradeoff between a compression performance and a visual quality and a low encoding latency, which leads to an improved coding efficiency. Some embodiments also provide an additional coding efficiency.

Different inventive embodiments and aspects are described, for example, in the chapters "Introduction", "Sample Adaptive Offset", "Classification for PSAO", "Decoder", "Encoder" and "Some Comments", wherein features, functionalities and details from the chapter "Sample Adaptive Offset" may optionally be introduced into any of the other embodiments.

However, the features, functionalities and details described in any other chapters can also, optionally, be introduced into the embodiments according to the present invention.

Also, the embodiments described in the above mentioned chapters can be used individually, and can also be supplemented by any of the features, functionalities and details in another chapter.

Also, it should be noted that individual aspects described herein can be used individually or in combination. Thus, details can be added to each of said individual aspects without adding details to another one of said aspects.

In particular, embodiments are also described in the claims. The embodiments described in the claims can optionally be supplemented by any of the features, functionalities and details as described herein, both individually and in combination.

It should also be noted that the present disclosure describes, explicitly or implicitly, features usable in a video encoder (apparatus for providing an encoded representation of an input video signal) and in a video decoder (apparatus for providing a decoded representation of a video signal on the basis of an encoded representation of a video signal). Thus, any of the features described herein can be used in the context of a video encoder and in the context of a video decoder.

Moreover, features and functionalities disclosed herein relating to a method can also be used in an apparatus (configured to perform such functionality). Furthermore, any features and functionalities disclosed herein with respect to an apparatus can also be used in a corresponding method. In other words, the methods disclosed herein can be supplemented by any of the features and functionalities described with respect to the apparatuses.

Also, any of the features and functionalities described herein can be implemented in hardware or in software, or using a combination of hardware and software, as will be described in the section "implementation alternatives".

IMPLEMENTATION ALTERNATIVES

Although some aspects are described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

The herein described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Subsequently, embedment are presented which represent broadenings of the embodiments set forth above, or differently speaking, embodiments, for which the above described embodiments represent specific examples with specific details, and for which these specific details may, individually or in combination, be used to further specify the subsequently presented embodiments.

Text in brackets represents optional features, examples and descriptions. Optional features, examples described with respect to a feature of a specific embodiment may also apply to equivalent or similar features of the other embodiments.

1. Arithmetic encoder for arithmetically encoding a sequence of information values into an arithmetic coded bitstream, configured to:
   symbolize the information values into symbol strings so as to obtain a sequence of symbols;
   arithmetically encode the sequence of symbols by, for each symbol,
   selecting a subinterval out of a plurality of subintervals into which a current interval, which defines a current version of an coding state of the arithmetic encoder, is subdivided according to a probability estimate for the respective symbol, according to a symbol value of the respective symbol so as to obtain an updated version of the coding state of the arithmetic encoder, defined by the selected subinterval, for encoding a next symbol of the sequence of symbols, and
   renormalizing encoder-internal parameters which define the coding state under continuing the bitstream,
   provide the bitstream with entry point information allowing for resuming arithmetic decoding the bitstream from a predetermined entry point onward.

2. The arithmetic encoder in accordance with embodiment 1, wherein the entry point information comprises information on an coding state of an arithmetic decoder, which occurs in the arithmetic decoder when the arithmetic decoder decodes the bitstream until the predetermined entry point.

3. The arithmetic encoder in accordance with embodiment 2, wherein the arithmetic encoder is configured to perform the arithmetic decoding the bitstream so as to determine the information on the coding state of the arithmetic decoder.

4. The arithmetic encoder in accordance with any of embodiments 2-3, wherein the coding state of the arithmetic decoder is defined by decoder-internal parameters including an interval width parameter indicating a width of the interval and a pointer pointing into the interval and the information on the coding state of the arithmetic decoder comprises a value of the pointer.

5. The arithmetic encoder in accordance with embodiment 4, wherein the arithmetic encoder is configured to perform the arithmetic decoding the bitstream and set the value of the pointer comprised by the information on the coding state of the arithmetic decoder to be equal to a current value of the pointer as manifesting itself in the arithmetic decoding the bitstream up to the predetermined entry point.

6. The arithmetic encoder in accordance with any of embodiments 2-3, wherein the coding state of the arithmetic decoder is defined by decoder-internal parameters including an interval width parameter indicating a width of the interval and a pointer pointing into the interval and the information on the coding state of the arithmetic decoder comprises a value of the interval width parameter.

7. The arithmetic encoder in accordance with embodiment 6, wherein the arithmetic encoder is configured to perform the arithmetic decoding the bitstream and set the value of the interval width parameter comprised by the information on the coding state of the arithmetic decoder to be equal to a current value of the interval width parameter as manifesting itself in the arithmetic decoding the bitstream up to the predetermined entry point, or set the value of the interval width parameter comprised by the information on the coding state of the arithmetic decoder to be equal to a current value of the interval width parameter as manifesting itself in the arithmetic encoding the sequence of symbols up to the predetermined entry point.

8. The arithmetic encoder in accordance with any of embodiments 2-3, wherein the coding state of the arithmetic decoder is defined by decoder-internal parameters including an interval width parameter indicating a width of the interval and a pointer pointing into the interval and the information on the coding state of the arithmetic decoder comprises a value of the pointer [e.g. which value is assumed by the pointer at the predetermined entry point] while being free of a value of the interval width parameter, wherein the arithmetic encoder is configured to set the value of the interval width parameter comprised by the information on the coding state of the arithmetic decoder to be equal to a predetermined value and use the predetermined value for the interval width parameter when resuming the arithmetic encoding the sequence of symbols from the predetermined entry point onwards, or preliminarily interrupting the arithmetic encoding the sequence of symbols by arithmetically encoding a symbol of a predetermined symbol value immediately ahead the predetermined entry point before resuming the arithmetic encoding the sequence of symbols from the predetermined entry point onwards, and set the value of the interval width parameter comprised by the information on the coding state of the arithmetic decoder to be equal to a current value of the interval width parameter as manifesting itself in the arithmetic encoding the sequence of symbols up to the predetermined entry point, including the symbol of the predetermined symbol value.

9. The arithmetic encoder in accordance with any of previous embodiments, wherein the entry point information comprises a bitstream pointer to a predetermined bit in the bitstream, which is up to be read next after the resuming the arithmetic decoding the bitstream from the predetermined entry point onwards.

10. The arithmetic encoder in accordance with embodiment 9, wherein the bitstream pointer to the predetermined bit in the bitstream is signaled in the bitstream in form of an offset relative to a begin of the bitstream.

11. The arithmetic encoder in accordance with embodiment 9, wherein the bitstream pointer to the predetermined bit in the bitstream is signaled in the bitstream in form of an offset relative to a trailing end of a run of leading bits of the bitstream based on which an coding state of the arithmetic decoder for performing the arithmetic decoding of the bitstream is to be initialized.

12. The arithmetic encoder in accordance with embodiment 9, wherein the entry point information allows for resuming arithmetic decoding the bitstream from more than one entry point onward, and the bitstream pointer to the predetermined bit in the bitstream is signaled in the bitstream in form of an offset relative to a previous entry point or relative to a predefined bitstream position which is associated with the predetermined entry point.

13. The arithmetic encoder in accordance with embodiment 12, configured to locate the predefined bitstream position as a point between consecutive ones of the sequence of values or by counting bits of the bitstream.

14. The arithmetic encoder in accordance with embodiment 12, wherein the bitstream pointer to the predetermined bit in the bitstream is stored in units of bits, and/or an integer multiple n of bits, with n>1, and n=8, for example.

15. The arithmetic encoder in accordance with embodiment 12, wherein a bit position in the bitstream of the previous entry point is signaled in the bitstream.

16. The arithmetic encoder in accordance with any of embodiments 12 to 15, wherein the bitstream pointer is signaled in the bitstream differentially with respect to a further bit stream pointer which is comprised by the entry point information for pointing to a further predetermined bit in the bitstream, which is up to be read next after a resuming the arithmetic decoding the bitstream from a preceding entry point onwards.

17. The arithmetic encoder in accordance with any of embodiments 9-15, wherein the bitstream pointer is signaled in the bitstream using a variable length code.

18. The arithmetic encoder in accordance with any of embodiments 9-17, wherein the bitstream pointer is signaled in the bitstream using an Exponential-Golomb code, preferably an unsigned Exponential-Golomb code.

19. The arithmetic encoder in accordance with any of embodiments 9-18, wherein the predetermined entry point is a third or any of entry points following after the third entry point relative to the begin of the bitstream, and the bitstream pointer to the predetermined bit in the bitstream is signaled in the bitstream in form of a difference between the offset relative to the previous entry point and an offset of the previous entry point relative to a further entry point preceding the previous entry point.

20. The arithmetic encoder in accordance with embodiment 19, wherein the bitstream pointer is signaled in the bitstream using a signed Exponential-Golomb code.

21. The arithmetic encoder in accordance with any of embodiments 19 to 20, wherein the bit position in the bitstream of the previous entry point is signaled in the bitstream using an unsigned Exponential-Golomb code.

22. The arithmetic encoder in accordance with embodiment 21, wherein an exponential Golomb code parameter for the Exponential-Golomb code is a value of 11.

23. The arithmetic encoder in accordance with any of embodiments 19 to 21, wherein the bitstream pointer is signaled in the bitstream using a signed Exponential-Golomb code.

24. The arithmetic encoder in accordance with embodiment 23, wherein an exponential Golomb code parameter for the Exponential-Golomb code is a value of 7.

25. The arithmetic encoder in accordance with any of previous embodiments, wherein the arithmetic encoder is configured to use context-adaptive arithmetic coding for arithmetically encoding the sequence of symbols, including selecting, for a context-adaptively encoded symbol of the sequence of symbols, a context model out of a plurality of context models, each of which has a probability estimate associated therewith, and adapting the probability estimates of the plurality of context models to actual symbol statistics using previously encoded symbols of the sequence of symbols, wherein the entry point information is indicative of, for each of a set of one or more predetermined context models, a predetermined probability estimate for the respective predetermined context model, and the arithmetic encoder is configured to use the predetermined probability estimate in resuming the adaptation of the probability estimates of the plurality of context models with respect to the respective predetermined context model.

26. The arithmetic encoder in accordance with any of previous embodiments, wherein the arithmetic encoder is configured to use context-adaptive arithmetic coding for arithmetically encoding the sequence of symbols, including selecting, for a context-adaptively encoded symbol of the sequence of symbols, a context model out of a plurality of context models, each of which has a probability estimate associated therewith, and adapting the probability estimates of the plurality of context models to actual symbol statistics using previously encoded symbols of the sequence of symbols, wherein the arithmetic encoder is configured to, for each of a set of one or more predetermined context models, set the probability estimate for the respective predetermined context model at the predetermined entry point to a default state and the arithmetic encoder is configured to use the default state in resuming the adaptation of the probability estimates of the plurality of context models with respect to the respective predetermined context model, or wherein the arithmetic encoder is configured to, for each of a set of one or more predetermined context models, set the probability estimate for the respective predetermined context model at the predetermined entry point to a saved state manifesting itself at a predetermined condition during arithmetically encoding the sequence of symbols ahead the predetermined entry point and the arithmetic encoder is configured to use the saved state in resuming the adaptation of the probability estimates of the plurality of context models with respect to the respective predetermined context model.

27. The arithmetic encoder in accordance with any of previous embodiments, wherein the arithmetic encoder is configured to use dependent quantization for deriving the sequence of information values from a sequence of unquantized values using state machine, wherein the entry point information comprises a quantization state manifesting itself in the state machine up to the predetermined entry point.

28. The arithmetic encoder in accordance with any of previous embodiments, wherein the symbols are bins and the symbolization is a binarization.

29. The arithmetic encoder in accordance with any of previous embodiments, wherein the information values is a sequence of syntax elements which represent a video.

30. The arithmetic encoder in accordance with any of embodiments 1-29, wherein the information values are neural network parameters.

31. Arithmetic decoder for arithmetically decoding a sequence of information values from a bitstream, configured to:

derive from the bitstream entry point information;

use the entry point information so as to resume arithmetically decoding the bitstream from a predetermined entry point onward by arithmetically decoding a sequence of symbols from the bitstream by, for each symbol of the bitstream:

determining, based on a current version of a coding state of the arithmetic decoder, a subinterval out of a plurality of subintervals into which a current interval is subdivided according to a probability estimate for the respective symbol, and deduce, based on the selected subinterval, a symbol value of the respective symbol, and renormalizing and updating decoder-internal parameters which define the coding state by use of the bitstream and the selected subinterval so as to obtain an updated version of the coding state of the arithmetic decoder for decoding a next symbol of the sequence of symbols, and derive the information values from the sequence of symbols by desymbolization.

32. The arithmetic decoder in accordance with embodiment 31, configured to use the entry point information so as to determine a starting version of the coding state of the arithmetic decoder and use the starting state for commencing arithmetically decoding the bitstream from the predetermined entry point onwards.

33. The arithmetic decoder in accordance with any of embodiments 31 or 32, wherein the coding state of the arithmetic decoder is defined by the decoder-internal parameters which include an interval width parameter indicating a width of the interval and a pointer pointing into the interval and the arithmetic decoder is configured to derive from the entry point information a starting value of the pointer using which the arithmetically decoding the bitstream from the predetermined entry point onwards is commenced.

34. The arithmetic decoder in accordance with any of embodiments 31-33, wherein the coding state of the arithmetic decoder is defined by the decoder-internal parameters which include an interval width parameter indicating a width of the interval and a pointer pointing into the interval and the arithmetic decoder is configured to derive from the entry point information a starting value of the interval width parameter using which the arithmetically decoding the bitstream from the predetermined entry point onwards is commenced.

35. The arithmetic decoder in accordance with any of embodiments 31-33, wherein the coding state of the arithmetic decoder is defined by the decoder-internal parameters which include an interval width parameter indicating a width of the interval and a pointer pointing into the interval and the arithmetic decoder is configured to derive from the entry point information a starting value of the pointer using which the arithmetically decoding the bitstream from the predetermined entry point onwards is commenced and to set the value of the interval width parameter comprised by the information on the coding state of the arithmetic decoder to be equal to a predetermined value and use the predetermined value for the interval width parameter for resuming the arithmetic decoding the sequence of symbols from the predetermined entry point onwards.

36. The arithmetic decoder in accordance with embodiment 35, wherein the entry point information allows for resuming arithmetic decoding the bitstream from more than one entry point onward and the arithmetic decoder is configured to preliminarily interrupting the arithmetic decoding the sequence of symbols at a subsequent predetermined entry point by arithmetically decoding a symbol of a predetermined symbol value immediately ahead the subsequent predetermined entry point before resuming the arithmetic decoding the sequence of symbols from the subsequent predetermined entry point onwards.

37. The arithmetic decoder in accordance with any of embodiments 31-36, configured to derive from the entry point information a bitstream pointer to a predetermined bit in the bitstream and use the predetermined bit as a bit to be read next after resuming the arithmetic decoding the bitstream from the predetermined entry point onwards.

38. The arithmetic decoder in accordance with embodiment 37, wherein the bitstream pointer to the predetermined bit in the bitstream is signaled in the bitstream in form of an offset relative to a begin of the bitstream.

39. The arithmetic decoder in accordance with embodiment 37, wherein the bitstream pointer to the predetermined bit in the bitstream is signaled in the bitstream in form of an offset relative to a trailing end of a run of leading bits of the bitstream based on which the arithmetic decoder is configured to initialize the coding state of the arithmetic decoder in case of performing the arithmetic decoding of the bitstream from the begin of the bitstream onwards.

40. The arithmetic decoder in accordance with embodiment 37, wherein the entry point information allows for resuming arithmetic decoding the bitstream from more than one entry point onward, and the bitstream pointer to the predetermined bit in the bitstream is signaled in the bitstream in form of an offset relative to a previous entry point or relative to a predefined bitstream position which is associated with the predetermined entry point.

41. The arithmetic decoder in accordance with embodiment 40, configured to locate the predefined bitstream position as a point between consecutive ones of the sequence of values or by counting bits of the bitstream.

42. The arithmetic decoder in accordance with embodiment 40, wherein the bitstream pointer to the predetermined bit in the bitstream is stored in units of bits, and/or an integer multiple n of bits, with n>1, and n=8, for example.

43. The arithmetic decoder in accordance with embodiment 42, wherein a bit position in the bitstream of the previous entry point is signaled in the bitstream.

44. The arithmetic decoder in accordance with any of embodiments 40 to 43, wherein the bitstream pointer is signaled in the bitstream differentially with respect to a further bit stream pointer which is comprised by the entry point information for pointing to a further predetermined bit in the bitstream, which is up to be read next after a resuming the arithmetic decoding the bitstream from a preceding entry point onwards.

45. The arithmetic decoder in accordance with any of embodiments 37-43, wherein the bitstream pointer is signaled in the bitstream using a variable length code.

46. The arithmetic decoder in accordance with any of embodiments 37-44, wherein the bitstream pointer is signaled in the bitstream using an Exponential-Golomb code, preferably an unsigned Exponential-Golomb code.

47. The arithmetic decoder in accordance with any of embodiments 37-46, wherein the predetermined entry point is a third or any of entry points following after the third entry point relative to the begin of the bitstream, and the bitstream pointer to the predetermined bit in the bitstream is signaled in the bitstream in form of a difference between the offset relative to the previous entry point and an offset of the previous entry point relative to a further entry point preceding the previous entry point.

48. The arithmetic decoder in accordance with embodiment 47, wherein the bitstream pointer is signaled in the bitstream using a signed Exponential-Golomb code.

49. The arithmetic decoder in accordance with any of embodiments 47 to 48, wherein the bit position in the bitstream of the previous entry point is signaled in the bitstream using an unsigned Exponential-Golomb code.

50. The arithmetic decoder in accordance with embodiment 49, wherein an exponential Golomb code parameter for the Exponential-Golomb code is a value of 11.

51. The arithmetic decoder in accordance with any of embodiments 47 to 50, wherein the bitstream pointer is signaled in the bitstream using a signed Exponential-Golomb code.

52. The arithmetic decoder in accordance with embodiment 51, wherein an exponential Golomb code parameter for the Exponential-Golomb code is a value of 7.

53. The arithmetic decoder in accordance with any of embodiments 31-52, wherein the arithmetic decoder is configured to use context-adaptive arithmetic decoding for arithmetically decoding the sequence of symbols, including selecting, for a context-adaptively decoded symbol of the sequence of symbols, a context model out of a plurality of context models, each of which has a probability estimate associated therewith, and adapting the probability estimates of the plurality of context models to actual symbol statistics using previously decoded symbols of the sequence of symbols, wherein the entry point information is indicative of, for each of a set of one or more predetermined context models, a predetermined probability estimate for the respective predetermined context model, and the arithmetic decoder is configured to use the predetermined probability estimate in resuming the adaptation of the probability estimates of the plurality of context models with respect to the respective predetermined context model.

54. The arithmetic decoder in accordance with any of embodiments 31-53, wherein the arithmetic decoder is configured to use context-adaptive arithmetic decoding for arithmetically decoding the sequence of symbols, including selecting, for a context-adaptively decoded symbol of the sequence of symbols, a context model out of a plurality of context models, each of which has a probability estimate associated therewith, and adapting the probability estimates of the plurality of context models to actual symbol statistics using previously decoded symbols of the sequence of symbols, wherein the arithmetic decoder is configured to, for each of a set of one or more predetermined context models, set the probability estimate for the respective predetermined context model at the predetermined entry point to a default state and the arithmetic decoder is configured to use the default state in resuming the adaptation of the probability estimates of the plurality of context models with respect to the respective predetermined context model.

55. The arithmetic decoder in accordance with embodiment 54, wherein the entry point information allows for resuming arithmetic decoding the bitstream from more than one entry point onward and the arithmetic decoder is configured to for each of the set of one or more predetermined context models, set the probability estimate for the respective predetermined context model at a subsequent predetermined entry point to a saved state manifesting itself at a predetermined condition during arithmetically decoding the sequence of symbols ahead the subsequent predetermined entry point and the arithmetic decoder is configured to use the saved state in resuming the adaptation of the probability estimates of the plurality of context models with respect to the respective predetermined context model from the subsequent predetermined entry point onwards.

56. The arithmetic decoder in accordance with any of embodiments 31-55, wherein the arithmetic decoder is configured to use dependent dequantization for deriving from the sequence of information values a sequence of quantized values using a state machine, derive from the entry point information a quantization state starting with which the dependent quantization is resumed from the predetermined entry point onwards.

57. The arithmetic decoder in accordance with any of embodiments 31-56, wherein the symbols are bins and the desymbolization is a debinarization.

58. The arithmetic decoder in accordance with any of embodiments 31-57, wherein the information values is a sequence of syntax elements which represent a video.

59. The arithmetic decoder in accordance with any of embodiments 31-57, wherein the information values are neural network parameters.

60. Arithmetic decoder for arithmetically decoding neural network parameters from a bitstream, configured to:

arithmetically decode a sequence of symbols from the bitstream by use of context-adaptive arithmetic decoding, including selecting, for a context-adaptively decoded symbol of the sequence of symbols, a context model out of a plurality of context models, each of which has a probability estimate associated therewith and arithmetically decoding the context-adaptively decoded symbol using the selected context model, and adapting the probability estimates of the plurality of context models to actual symbol statistics using previously decoded symbols of the sequence of symbols, derive the neural network parameters from the sequence of symbols by desymbolization, at the beginning of the bitstreams and/or at one or more entry points within the bitstream, initialize, for each of a set of one or more context models, the probability estimate associated with the respective context model based on context model information in the bitstream.

61. Arithmetic decoder of embodiment 60, configured to adapt the probability estimates of the plurality of context models to actual symbol statistics using previously decoded symbols of the sequence of symbols by for each context model, generating the probability estimate associated with the respective context model on the basis of previously context-adaptively decoded symbols of the sequence of symbols for which the respective context model has been selected.

62. Arithmetic decoder of embodiment 60 or 61, configured to adapt the probability estimates of the plurality of context models to actual symbol statistics using previously decoded symbols of the sequence of symbols by deriving a first hypothesis for the probability estimates at a manner which adapts to the actual symbol statistics at a first adaptation agility which is controllable by a first agility parameter, at the beginning of the bitstream and/or at one or more entry points within the bitstream, set, for each of the set of one or more context models, the first hypothesis and the first agility parameter associated with the respective context model based on the context model information in the bitstream.

63. Arithmetic decoder of embodiment 62, configured to adapt the probability estimates of the plurality of context models to actual symbol statistics using previously decoded symbols of the sequence of symbols by deriving a second hypothesis for the probability estimates at a manner which adapts to the actual symbol statistics at a second adaptation agility which is controllable by a second agility parameter, wherein the probability estimates are determined by an average of the first and second hypotheses, at the beginning of the bitstream and/or at one or more entry points within the bitstream, set, for each of the set of one or more context models, the second hypothesis and the second agility parameter associated with the respective context model based on the context model information in the bitstream.

64. Arithmetic decoder of embodiment 63, wherein the context model information in the bitstream comprises a table entry index into a table of quadruples of values for defining the first and second hypotheses and the first and second agility parameters, and the arithmetic decoder is configured to use the table entry index so as to select one quadruple of the table and to use the one quadruple so as to set the first and second hypotheses and the first and second agility parameters.

65. Arithmetic decoder of embodiment 64, wherein a number of the quadruples of values for defining the first and second hypotheses and the first and second agility parameters lies between 8 and 10, both inclusively.

66. Arithmetic decoder of any of embodiments 64 and 65, wherein the quadruples of values for defining the first and second hypotheses and the first and second agility parameters correspond to one of 3, 4 or 5 mutually distinguishable settings for the first and second agility parameters.

67. Arithmetic decoder of any of embodiments 64 to 66, wherein the symbols are bins and the desymbolization is a debinarization and the quadruples of values for defining the first and second hypotheses and the first and second agility parameters comprise first 3 quadruples according to all of which the first agility parameter is set to a first value, the second agility parameter is set to a second value, which corresponds to lower adaptation agility than the first value, and according to a first one of which the first and second hypotheses correspond to equi-probability, according to a second one of which the first and second hypotheses correspond to a first bin value being more probable than a second bin value, and according to a third one of which the first and second hypotheses correspond to the second bin value being more probable than the first bin value, second 3 quadruples according to all of which the first agility parameter is set to a third value, which corresponds to lower adaptation agility than the first value, and larger adaptation agility than the second value, and the second agility parameter is set to a fourth value, which corresponds to lower adaptation agility than the second value, and according to a first and second one of which the first and second hypotheses correspond to the first bin value being more probable than the second bin value, and according to a third one of which the first and second hypotheses correspond to the second bin value being more probable than the first bin value, 2 quadruples according to all of which the first agility parameter is set to a fourth value, which corresponds to lower adaptation agility than the third value, and larger adaptation agility than the second value, and the second agility parameter is set to a sixth value, which corresponds to lower adaptation agility than the second value, and larger adaptation agility than the fourth value, and according to a first one of which the first and second hypotheses correspond to equi-probability, and according to a second one of which the first and second hypotheses correspond to the first bin value being more probable than the second bin value, 1 quadruple according to which the first agility parameter is set to a seventh value, which corresponds to larger adaptation agility than the first value, and according to which the first and second hypotheses correspond to equi-probability.

68. Arithmetic decoder of any of embodiments 63 to 67, wherein the symbols are bins and the desymbolization is a debinarization and the arithmetic decoder is configured to adapt the probability estimates of the plurality of context models to actual symbol statistics using previously decoded symbols of the sequence of symbols by, for each of the first and second hypotheses, representing the respective hypothesis by means of a singed integer, respectively, which, when being zero, is indicative of equi-probability, which, when being larger than zero, is indicative of a first bin value being more probable than a second bin value, and which, when being lower than zero, is indicative of the second bin value being more probable than the first bin value, for each context model, increase the singed integer if a currently decoded bin has the first bin value, and decrease the singed integer if a currently decoded bin has the second bin value, at an amount which is controlled by the first agility parameter with respect to the first hypothesis and controlled by the second agility parameter with respect to the second hypothesis so that the amount is the larger the smaller the first and second agility parameter is, respectively, wherein the probability estimates are determined by an average of the first and second singed integers.

69. Arithmetic decoder of embodiment 68, configured to determine the amount for the increase and decrease by use of a transition table.

70. Arithmetic decoder of embodiment 69, configured to use the same transition table for the first and second hypotheses.

71. Arithmetic decoder of embodiment 69 or 70, configured to determine the amount for the increase and decrease by use of the transition table by looking up the transition table at an entry indexed by a table index determined by the signed integer to obtain a transition step and dividing the transition step size by 2 to a power which depends on the first and second adaptation parameter, respectively, wherein the transition step determines the amount.

72. Arithmetic decoder of embodiment 69 or 70, wherein the signed integer is represented by a 2's-complement representation with n bits, with n being larger for the second hypothesis than for the first hypothesis, wherein the arithmetic decoder is configured to determine the amount for the increase and decrease by use of the transition table by looking up the transition table at an entry indexed by a sum of the signed integer divided by $2^{n-m}$ on the one hand and $2^{m-1}$ on the other hand in case to obtain a transition step dividing the transition step size by 2 to a power which affine linearly depends on the first and second adaptation parameter, respectively, wherein the transition step determines the amount.

73. Arithmetic decoder of embodiment 72, wherein the transition steps stored in the entries of the transition table increase or decrease monotonically.

74. A method (100) of arithmetically encoding a sequence of information values into an arithmetic coded bitstream, comprising:

symbolizing (101) the information values into symbol strings so as to obtain a sequence of symbols;

arithmetically encoding (102) the sequence of symbols by subdividing (103) a current interval, which defines a current version of an coding state of an arithmetic encoder, for each symbol, according to a probability estimate for the respective symbol, selecting (104) a subinterval out of a plurality of the subintervals according to a symbol value of the respective symbol so as to obtain an updated version of the coding state of the arithmetic encoder, defined by the selected subinterval, for encoding a next symbol of the sequence of symbols, and renormalizing (105) encoder-internal parameters which define the coding state under continuing the bitstream, providing (106) the bitstream with entry point information allowing for resuming arithmetic decoding the bitstream from a predetermined entry point onward.

75. The method in accordance with embodiment 74, wherein the entry point information comprises information on an coding state of an arithmetic decoder, which occurs in the arithmetic decoder when the arithmetic decoder decodes the bitstream until the predetermined entry point.

76. The method in accordance with embodiment 75, further comprising performing the arithmetic decoding the bitstream so as to determine the information on the coding state of the arithmetic decoder.

77. The method in accordance with any of embodiments 75-76, wherein the coding state of the arithmetic decoder is defined by decoder-internal parameters including an interval width parameter indicating a width of the interval and a pointer pointing into the interval and the information on the coding state of the arithmetic decoder comprises a value of the pointer.

78. The method in accordance with embodiment 77, further comprising performing the arithmetic decoding the bitstream and setting the value of the pointer comprised by the information on the coding state of the arithmetic decoder to be equal to a current value of the pointer as manifesting itself in the arithmetic decoding the bitstream up to the predetermined entry point.

79. The method in accordance with any of embodiments 75-76, wherein the coding state of the arithmetic decoder is defined by decoder-internal parameters including an interval width parameter indicating a width of the interval and a pointer pointing into the interval and the information on the coding state of the arithmetic decoder comprises a value of the interval width parameter.

80. The method in accordance with embodiment 79, further comprising performing the arithmetic decoding the bitstream and setting the value of the interval width parameter comprised by the information on the coding state of the arithmetic decoder to be equal to a current value of the interval width parameter as manifesting itself in the arithmetic decoding the bitstream up to the predetermined entry point, or setting the value of the interval width parameter comprised by the information on the coding state of the arithmetic decoder to be equal to a current value of the interval width parameter as manifesting itself in the arithmetic encoding the sequence of symbols up to the predetermined entry point.

81. The method in accordance with any of embodiments 75-76, wherein the coding state of the arithmetic decoder is defined by decoder-internal parameters including an interval width parameter indicating a width of the interval and a pointer pointing into the interval and the information on the coding state of the arithmetic decoder comprises a value of the pointer while being free of a value of the interval width parameter, wherein the method further comprises setting the value of the interval width parameter comprised by the information on the coding state of the arithmetic decoder to be equal to a predetermined value and using the predetermined value for the interval width parameter when resuming the arithmetic encoding the sequence of symbols from the predetermined entry point onwards, or preliminarily interrupting the arithmetic encoding the sequence of symbols by arithmetically encoding a symbol of a predetermined symbol value immediately ahead the predetermined entry point before resuming the arithmetic encoding the sequence of symbols from the predetermined entry point onwards, and setting the value of the interval width parameter comprised by the information on the coding state of the arithmetic decoder to be equal to a current value of the interval width parameter as manifesting itself in the arithmetic encoding the sequence of symbols up to the predetermined entry point, including the symbol of the predetermined symbol value.

82. The method in accordance with any of embodiments 74-81, wherein the entry point information comprises a bitstream pointer to a predetermined bit in the bitstream, which is up to be read next after the resuming the arithmetic decoding the bitstream from the predetermined entry point onwards.

83. The method in accordance with embodiment 82, wherein the bitstream pointer to the predetermined bit in the bitstream is signaled in the bitstream in form of an offset relative to a begin of the bitstream.

84. The method in accordance with embodiment 82, wherein the bitstream pointer to the predetermined bit in the bitstream is signaled in the bitstream in form of an offset relative to a trailing end of a run of leading bits of the bitstream based on which an coding state of an arithmetic decoder for performing the arithmetic decoding of the bitstream is to be initialized.

85. The method in accordance with embodiment 82, wherein the entry point information allows for resuming arithmetic decoding the bitstream from more than one entry point onward, and the bitstream pointer to the predetermined bit in the bitstream is signaled in the bitstream in form of an offset relative to a previous entry point or relative to a predefined bitstream position which is associated with the predetermined entry point.

86. The method in accordance with embodiment 85, comprising locating the predefined bitstream position as a point between consecutive ones of the sequence of values or by counting bits of the bitstream.

87. The method in accordance with embodiment 85, wherein the bitstream pointer to the predetermined bit in the bitstream is stored in units of bits, and/or an integer multiple n of bits, with n>1, and n=8, for example.

88. The method in accordance with embodiment 85, wherein a bit position in the bitstream of the previous entry point is signaled in the bitstream.

89. The method in accordance with any of embodiments 85 to 88, wherein the bitstream pointer is signaled in the bitstream differentially with respect to a further bit stream pointer which is comprised by the entry point information for pointing to a further predetermined bit in the bitstream, which is up to be read next after a resuming the arithmetic decoding the bitstream from a preceding entry point onwards.

90. The method in accordance with any of embodiments 82-89, wherein the bitstream pointer is signaled in the bitstream using a variable length code.

91. The method in accordance with any of embodiments 82-90, wherein the bitstream pointer is signaled in the bitstream using an Exponential-Golomb code, preferably an unsigned Exponential-Golomb code.

92. The method in accordance with any of embodiments 82-91, wherein the predetermined entry point is a third or any of entry points following after the third entry point relative to the begin of the bitstream, and the bitstream pointer to the predetermined bit in the bitstream is signaled in the bitstream in form of a difference between the offset relative to the previous entry point and an offset of the previous entry point relative to a further entry point preceding the previous entry point.

93. The method in accordance with embodiment 92, wherein the bitstream pointer is signaled in the bitstream using a signed Exponential-Golomb code.

94. The method in accordance with any of embodiments 92 to 93, wherein the bit position in the bitstream of the previous entry point is signaled in the bitstream using an unsigned Exponential-Golomb code.

95. The method in accordance with embodiment 94, wherein an exponential Golomb code parameter for the Exponential-Golomb code is a value of 11.

96. The method in accordance with any of embodiments 92 to 95, wherein the bitstream pointer is signaled in the bitstream using a signed Exponential-Golomb code.

97. The method in accordance with embodiment 96, wherein an exponential Golomb code parameter for the Exponential-Golomb code is a value of 7.

98. A method (200) of arithmetically decoding a sequence of information values from a bitstream, comprising:

deriving (201) from the bitstream entry point information;

using (202) the entry point information so as to resume arithmetically decoding the bitstream from a predetermined entry point onward by arithmetically decoding a sequence of symbols from the bitstream by, for each symbol of the bitstream:

determining (203), a current version of an coding state of an arithmetic decoder, a subinterval out of a plurality of subintervals into which a current interval is subdivided according to a probability estimate for the respective symbol, and deducing (204), based on the selected subinterval, a symbol value of the respective symbol, and renormalizing and updating (205) decoder-internal parameters which define the coding state by use of the bitstream and the selected subinterval so as to obtain an updated version of the coding state of the arithmetic decoder for decoding a next symbol of the sequence of symbols, and deriving (206) the information values from the sequence of symbols by desymbolization.

99. The method in accordance with embodiment 98, further comprising using the entry point information so as to determine a starting version of the coding state of the arithmetic decoder and using the starting state for commencing arithmetically decoding the bitstream from the predetermined entry point onwards.

100. The method in accordance with any of embodiments 98 or 99, wherein the coding state of the arithmetic decoder is defined by decoder-internal parameters including an interval width parameter indicating a width of the interval and a pointer pointing into the interval and the method further comprises deriving from the entry point information a starting value of the pointer using which the arithmetically decoding the bitstream from the predetermined entry point onwards is commenced.

101. The method in accordance with any of embodiments 98-100, wherein the coding state of the arithmetic decoder is defined by decoder-internal parameters including an interval width parameter indicating a width of the interval and a pointer pointing into the interval and the method further comprises deriving from the entry point information a starting value of the interval width parameter using which the arithmetically decoding the bitstream from the predetermined entry point onwards is commenced.

102. The method in accordance with any of embodiments 98-100, wherein the coding state of the arithmetic decoder is defined by decoder-internal parameters including an interval width parameter indicating a width of the interval and a pointer pointing into the interval and the method further comprises:

deriving from the entry point information a starting value of the pointer using which the arithmetically decoding the bitstream from the predetermined entry point onwards is commenced and setting the value of the interval width parameter comprised by the information on the coding state of the arithmetic decoder to be equal to a predetermined value and use the predetermined value for the interval width parameter for resuming the arithmetic decoding the sequence of symbols from the predetermined entry point onwards.

103. The method in accordance with embodiment 102, wherein the entry point information allows for resuming arithmetic decoding the bitstream from more than one entry point onward and the method further comprises preliminarily interrupting the arithmetic decoding the sequence of symbols at a subsequent predetermined entry point by arithmetically decoding a symbol of a predetermined symbol value immediately ahead the subsequent predetermined entry point before resuming the arithmetic encoding the sequence of symbols from the subsequent predetermined entry point onwards.

104. The method in accordance with any of embodiments 98-103, further comprising deriving from the entry point information a bitstream pointer to a predetermined bit in the bitstream and using the predetermined bit as a bit to be read next after resuming the arithmetic decoding the bitstream from the predetermined entry point onwards.

105. The method in accordance with embodiment 104, wherein the bitstream pointer to the predetermined bit in the bitstream is signaled in the bitstream in form of an offset relative to a begin of the bitstream.

106. The method in accordance with embodiment 104, wherein the bitstream pointer to the predetermined bit in the bitstream is signaled in the bitstream in form of an offset relative to a trailing end of a run of leading bits of the bitstream based on which the method further initializes the coding state of the arithmetic decoder in case of performing the arithmetic decoding of the bitstream from the begin of the bitstream onwards.

107. The method in accordance with embodiment 104, wherein the entry point information allows for resuming arithmetic decoding the bitstream from more than one entry point onward, and the bitstream pointer to the predetermined bit in the bitstream is signaled in the bitstream in form of an offset relative to a previous entry point or relative to a predefined bitstream position which is associated with the predetermined entry point.

108. The method in accordance with embodiment 107, comprising locating the predefined bitstream position as a point between consecutive ones of the sequence of values or by counting bits of the bitstream.

109. The method in accordance with embodiment 107, wherein the bitstream pointer to the predetermined bit in the bitstream is stored in units of bits, and/or an integer multiple n of bits, with n>1, and n=8, for example.

110. The method in accordance with embodiment 107, wherein a bit position in the bitstream of the previous entry point is signaled in the bitstream.

111. The method in accordance with any of embodiments 104 to 110, wherein the bitstream pointer is signaled in the bitstream differentially with respect to a further bit stream pointer which is comprised by the entry point information for pointing to a further predetermined bit in the bitstream, which is up to be read next after a resuming the arithmetic decoding the bitstream from a preceding entry point onwards.

112. The method in accordance with any of embodiments 104-111, wherein the bitstream pointer is signaled in the bitstream using a variable length code.

113. The method in accordance with any of embodiments 104-112, wherein the bitstream pointer is signaled in the bitstream using an Exponential-Golomb code, preferably an unsigned Exponential-Golomb code.

114. The method in accordance with any of embodiments 104-113, wherein the predetermined entry point is a third or any of entry points following after the third entry point relative to the begin of the bitstream, and the bitstream pointer to the predetermined bit in the bitstream is signaled in the bitstream in form of a difference between the offset relative to the previous entry point and an offset of the previous entry point relative to a further entry point preceding the previous entry point.

115. The method in accordance with embodiment 114, wherein the bitstream pointer is signaled in the bitstream using a signed Exponential-Golomb code.

116. The method in accordance with any of embodiments 114 to 115, wherein the bit position in the bitstream of the previous entry point is signaled in the bitstream using an unsigned Exponential-Golomb code.

117. The method in accordance with embodiment 116, wherein an exponential Golomb code parameter for the Exponential-Golomb code is a value of 11.

118. The method in accordance with any of embodiments 114 to 117, wherein the bitstream pointer is signaled in the bitstream using a signed Exponential-Golomb code.

119. The method in accordance with embodiment 118, wherein an exponential Golomb code parameter for the Exponential-Golomb code is a value of 7.

120. The method in accordance with any of embodiments 98-119, further comprising using context-adaptive arithmetic decoding for arithmetically decoding the sequence of symbols, including selecting, for a context-adaptively decoded symbol of the sequence of symbols, a context model out of a plurality of context models, each of which has a probability estimate associated therewith, and adapting the probability estimates of the plurality of context models to actual symbol statistics using previously decoded symbols of the sequence of symbols, wherein the entry point information is indicative of, for each of a set of one or more predetermined context models, a predetermined probability estimate for the respective predetermined context model, and the method further comprises using the predetermined probability estimate in resuming the adaptation of the probability estimates of the plurality of context models with respect to the respective predetermined context model.

121. The method in accordance with any of embodiments 98-120, further comprising using context-adaptive arithmetic decoding for arithmetically decoding the sequence of symbols, including selecting, for a context-adaptively decoded symbol of the sequence of symbols, a context model out of a plurality of context models, each of which has a probability estimate associated therewith, and adapting the probability estimates of the plurality of context models to actual symbol statistics using previously decoded symbols of the sequence of symbols, wherein the method further comprises, for each of a set of one or more predetermined context models, setting the probability estimate for the respective predetermined context model at the predetermined entry point to a default state and the method further comprises using the default state in resuming the adaptation of the probability estimates of the plurality of context models with respect to the respective predetermined context model.

122. The method in accordance with embodiment 121, wherein the entry point information allows for resuming arithmetic decoding the bitstream from more than one entry point onward and the method further comprises for each of the set of one or more predetermined context models, setting the probability estimate for the respective predetermined context model at a subsequent predetermined entry point to a saved state manifesting itself at a predetermined condition during arithmetically decoding the sequence of symbols ahead the subsequent predetermined entry point and the method further comprises using the saved state in resuming the adaptation of the probability estimates of the plurality of context models with respect to the respective predetermined context model from the subsequent predetermined entry point onwards.

123. The method in accordance with any of embodiments 98-122, further comprising:

using dependent dequantization for deriving from the sequence of information values a sequence of quantized values using a state machine, deriving from the entry point information a quantization state starting with which the dependent quantization is resumed from the predetermined entry point onwards.

124. The method in accordance with any of embodiments 98-123, wherein the symbols are bins and the desymbolization is a debinarization.

125. The method in accordance with any of embodiments 98-124, wherein the information values is a sequence of syntax elements which represent a video.

126. The method in accordance with any of embodiments 98-124, wherein the information values are neural network parameters.

127. Arithmetic encoder for arithmetically encoding neural network parameters into a bitstream, configured to:

derive from the neural network parameters a sequence of symbols by symbolization, arithmetically encode the sequence of symbols into the bitstream by use of context-adaptive arithmetic encoding, including selecting, for a context-adaptively encoded symbol of the sequence of symbols, a context model out of a plurality of context models, each of which has a probability estimate associated therewith and arithmetically encoding the context-adaptively encoded symbol using the selected context model, and adapting the probability estimates of the plurality of context models to actual symbol statistics using previously encoded symbols of the sequence of symbols, at the beginning of the bitstreams and/or at one or more entry points within the bitstream, initialize, for each of a set of one or more context models, the probability estimate associated with the respective context model according to context model information signaled in the bitstream.

128. Arithmetic encoder of embodiment 127, configured to adapt the probability estimates of the plurality of context models to actual symbol statistics using previously encoded symbols of the sequence of symbols by
for each context model, generating the probability estimate associated with the respective context model on the basis of previously context-adaptively encoded symbols of the sequence of symbols for which the respective context model has been selected.

129. Arithmetic encoder of embodiment 127 or 128 configured to adapt the probability estimates of the plurality of context models to actual symbol statistics using previously encoded symbols of the sequence of symbols by deriving a first hypothesis for the probability estimates at a manner which adapts to the actual symbol statistics at a first adaptation agility which is controllable by a first agility parameter, at the beginning of the bitstreams and/or at one or more entry points within the bitstream, set, for each of the set of one or more context models, the first hypothesis and the first agility parameter associated with the respective context model according to the context model information signaled in the bitstream.

130. Arithmetic encoder of embodiment 127, configured to adapt the probability estimates of the plurality of context models to actual symbol statistics using previously encoded symbols of the sequence of symbols by deriving a second hypothesis for the probability estimates at a manner which adapts to the actual symbol statistics at a second adaptation agility which is controllable by a second agility parameter and forming an average of the first and second hypothesis, at the beginning of the bitstream and/or at one or more entry points within the bitstream, set, for each of the set of one or more context models, the second hypothesis and the second agility parameter associated with the respective context model according to the context model information signaled in the bitstream.

131. Arithmetic encoder of embodiment 130, wherein the context model information in the bitstream comprises a table entry index into a table of quadruples of values for defining the first and second hypotheses and the first and second agility parameters, and the arithmetic encoder is configured to use the table entry index so as to select one quadruple of the table and to use the one quadruple so as to set the first and second hypotheses and the first and second agility parameters.

132. Arithmetic encoder of embodiment 130, wherein a number of the quadruples of values for defining the first and second hypotheses and the first and second agility parameters lies between 8 and 10, both inclusively.

133. Arithmetic encoder of any of embodiments 131 and 132, wherein the quadruples of values for defining the first and second hypotheses and the first and second agility parameters correspond to one of 3, 4 or 5 mutually distinguishable settings for the first and second agility parameters.

134. Arithmetic encoder of any of embodiments 131 to 133, wherein the quadruples of values for defining the first and second hypotheses and the first and second agility parameters comprise first 3 quadruples according to all of which the first agility parameter is set to a first value, the second agility parameter is set to a second value, which corresponds to lower adaptation agility than the first value, and according to a first one of which the first and second hypotheses correspond to equi-probability, according to a second one of which the first and second hypotheses correspond to a first bin value being more probable than a second bin value, and according to a third one of which the first and second hypotheses correspond to the second bin value being more probable than the first bin value, second 3 quadruples according to all of which the first agility parameter is set to a third value, which corresponds to lower adaptation agility than the first value, and larger adaptation agility than the second value, and the second agility parameter is set to a fourth value, which corresponds to lower adaptation agility than the second value, and according to a first and second one of which the first and second hypotheses correspond to the first bin value being more probable than the second bin value, and according to a third one of which the first and second hypotheses correspond to the second bin value being more probable than the first bin value, 2 quadruples according to all of which the first agility parameter is set to a fourth value, which corresponds to lower adaptation agility than the third value, and larger adaptation agility than the second value, and the second agility parameter is set to a sixth value, which corresponds to lower adaptation agility than the second value, and larger adaptation agility than the fourth value, and according to a first one of which the first and second hypotheses correspond to equi-probability, and according to a second one of which the first and second hypotheses correspond to the first bin value being more probable than the second bin value, 1 quadruple according to which the first agility parameter is set to a seventh value, which corresponds to larger adaptation agility than the first value, and according to which the first and second hypotheses correspond to equi-probability.

135. Arithmetic encoder of any of embodiments 130 to 134, wherein the symbols are bins and the symbolization is a binarization and the arithmetic encoder is configured to adapt the probability estimates of the plurality of context models to actual symbol statistics using previously encoded symbols of the sequence of symbols by, for each of the first and second hypotheses, representing the respective hypothesis by means of a singed integer, respectively, which, when being zero, is indicative of equi-probability, which, when being larger than zero, is indicative of a first bin value being more probable than a second bin value, and which, when being lower than zero, is indicative of the second bin value being more probable than the first bin value, for each context model, increase the singed integer if a currently encoded bin has the first bin value, and decrease the singed integer if a currently encoded bin has the second bin value, at an amount which is controlled by the first agility parameter with respect to the first hypothesis and controlled by the second agility parameter with respect to the second hypothesis so that the amount is the larger the smaller the first and second agility parameter is, respectively, wherein the probability estimates are determined by an average of the first and second singed integers.

136. Arithmetic encoder of embodiment 135, configured to determine the amount for the increase and decrease by use of a transition table.

137. Arithmetic encoder of embodiment 136, configured to use the same transition table for the first and second hypotheses.

138. Arithmetic encoder of embodiment 136 or 137, configured to determine the amount for the increase and decrease by use of the transition table by looking up the transition table at an entry indexed by a table index determined by the signed integer to obtain a transition step and dividing the transition step size by 2 to a power which depends on the first and second adaptation parameter, respectively, wherein the transition step determines the amount.

139. Arithmetic encoder of embodiment 136 or 137, wherein the signed integer is represented by a 2's-complement representation with n bits, with n being larger for the second hypothesis than for the first hypothesis, wherein the arithmetic encoder is configured to determine the amount for the increase and decrease by use of the transition table by looking up the transition table at an entry indexed by a sum of the signed integer divided by $2^{n-m}$ on the one hand and $2^{m-1}$ on the other hand in case to obtain a transition step dividing the transition step size by 2 to a power which affine linearly depends on the first and second adaptation parameter, respectively, wherein the transition step determines the amount.

140. Arithmetic encoder of embodiment 139, wherein the transition steps stored in the entries of the transition table increase or decrease monotonically.

141. Computer program having a program code for performing, when running on a computer, methods according to any of embodiments 74-126.

142. A bitstream generated using an arithmetic encoder of any of embodiments 1-30, 127-140.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method of arithmetically encoding a sequence of information values into an arithmetic coded bitstream, comprising:

symbolizing the information values into symbol strings so as to acquire a sequence of symbols;

arithmetically encoding the sequence of symbols by subdividing a current interval, which defines a current version of a coding state of an arithmetic encoder, for each symbol, according to a probability estimate for the respective symbol, into a plurality of the subintervals, selecting a subinterval out of the plurality of the subintervals according to a symbol value of the respective symbol so as to acquire an updated version of the coding state of the arithmetic encoder, defined by the selected subinterval, for encoding a next symbol of the sequence of symbols, renormalizing encoder-internal parameters which define the coding state under continuing the bitstream, and providing the bitstream with entry point information allowing for resuming arithmetic decoding the bitstream from a predetermined entry point onward, wherein the entry point information comprises information on a coding state of an arithmetic decoder, which occurs in the arithmetic decoder when the arithmetic decoder decodes the bitstream until the predetermined entry point, wherein the coding state of the arithmetic decoder is defined by decoder-internal parameters comprising an interval width parameter indicating a width of the current interval and a pointer pointing into the current interval and the information on the coding state of the arithmetic decoder comprises a value of the pointer.

2. A digital storage medium storing a bitstream generated using the method of claim 1.

3. A method of arithmetically decoding a sequence of information values from a bitstream, comprising:

deriving from the bitstream entry point information;

using the entry point information so as to resume arithmetically decoding the bitstream from a predetermined entry point onward by arithmetically decoding a sequence of symbols from the bitstream by, for each symbol of the bitstream:

determining, based on a current version of a coding state of an arithmetic decoder, a subinterval out of a plurality of subintervals into which a current interval is subdivided according to a probability estimate for the respective symbol, and deducing, based on the selected subinterval, a symbol value of the respective symbol, and renormalizing and updating decoder-internal parameters which define the coding state by use of the bitstream and the selected subinterval so as to acquire an updated version of the coding state of the arithmetic decoder for decoding a next symbol of the sequence of symbols, and deriving the information values from the sequence of symbols by desymbolization, wherein the coding state of the arithmetic decoder is defined by the decoder-internal parameters which comprise an interval width parameter indicating a width of the current interval and a pointer pointing into the current interval and the arithmetic decoder is configured to derive from the entry point information a starting value of the pointer using which the arithmetically decoding the bitstream from the predetermined entry point onwards is commenced.

* * * * *